United States Patent [19]
Ono et al.

[11] Patent Number: 5,479,544
[45] Date of Patent: Dec. 26, 1995

[54] OPTICAL RECEIVER, OPTICAL SEMICONDUCTOR APPARATUS, AND OPTICAL COMMUNICATION SYSTEM UTILIZING THE SAME

[75] Inventors: Takeo Ono, Sagamihara; Masao Majima, Isehara; Toshihiko Ouchi, Machida, all of Japan

[73] Assignee: Canon Kabushiki Kaisha, Tokyo, Japan

[21] Appl. No.: 124,489

[22] Filed: Sep. 22, 1993

[30]  Foreign Application Priority Data

Oct. 3, 1992 [JP] Japan .................................. 4-289551

[51] Int. Cl.$^6$ ..................................................... G02B 6/00
[52] U.S. Cl. .............................. 385/37; 372/94; 359/180
[58] Field of Search .............................. 385/14, 24, 25, 385/27, 31, 36, 37, 44, 46, 15, 11, 123, 37; 372/6, 96, 8, 20, 98; 359/285, 308, 93, 53, 56, 180, 493, 634

[56]  References Cited

U.S. PATENT DOCUMENTS

| | | | |
|---|---|---|---|
| 4,006,964 | 2/1977 | Mahleein et al. | 385/27 |
| 4,146,297 | 3/1979 | Alferness et al. | 385/27 |
| 4,323,428 | 4/1982 | Schallenberger et al. | 376/353 |
| 4,723,795 | 2/1988 | Shenoy | 285/138 |
| 5,015,435 | 5/1991 | Petit | 376/285 |
| 5,031,993 | 7/1991 | Asthana et al. | 385/27 X |
| 5,048,909 | 9/1991 | Henry et al. | 385/27 |
| 5,073,004 | 12/1991 | Clayton et al. | 385/27 |
| 5,099,350 | 3/1992 | Hisao | 339/180 |
| 5,189,714 | 2/1993 | Okayama et al. | 385/27 |
| 5,267,256 | 11/1993 | Saruwatari et al. | 372/6 X |
| 5,339,157 | 8/1994 | Glance et al. | 385/37 X |
| 5,355,237 | 10/1994 | Lang et al. | 385/37 X |
| 5,363,226 | 11/1994 | Strasser et al. | 385/37 X |

FOREIGN PATENT DOCUMENTS 0238964  9/1987  European Pat. Off. .
0389172  9/1990  European Pat. Off. .

OTHER PUBLICATIONS

Appl. Phys. Let. vol. 59, No. 15, Oct. 7, 1991, pp. 1823–1825, Deri et al., "Ultracompact monolithic integration of polarization diversity waveguide/photodiodes", Pat. Abs. JP., vol. 7, No. 253 (P–235) Oct. 11, 1983 (JP–A–58 137 808).
J. Lightwave Technology, Sep. 1988, vol. 6, No. 9, Kaminow et al. "FDMA–FSK Star Network with a Tunable Optical Filter Demultiplexer".

Primary Examiner—Akm E. Ullah
Attorney, Agent, or Firm—Fitzpatrick, Cella, Harper & Scinto

[57]  ABSTRACT

In optical communications, an optical receiver or semiconductor apparatus and an optical communication system using the semiconductor apparatus of the present invention solve the problem of polarization dependency. The optical receiver or optical semiconductor apparatus includes a pair of optical filters arranged such that tuned wavelengths for two different modes, e.g., tuned wavelengths for TE and TM modes, are set as light components having the same wavelength, and a beam splitting path for directing signal light to the pair of optical filters. Alternatively, the optical receiver or optical semiconductor apparatus includes a filter waveguide or waveguides capable of setting the tuned wavelength of one mode (e.g., TE) to be the same as the tuned wavelength of the other mode (e.g., TM) of two modes having different orders of transverse modes (e.g., two orthogonal modes), and an input waveguide. The input waveguide and filter waveguide are arranged to equally couple a signal light to those two modes.

33 Claims, 24 Drawing Sheets

TRANSMITTANCE CHARACTERISTIC OF FILTER 1

$\lambda b = 2\, neff\, A/m$
1. $neff1\,(TE) = neff2\,(TM)$
2. $neff\,(TE)/neff\,(TM) = A2/A1$

TRANSMITTANCE CHARACTERISTIC OF FILTER 2

$In_{1-x1}Ga_{x1}As_{y1}P_{1-y1}$ $In_{1-x2}Ga_{x2}As_{y2}P_{1-y2}$

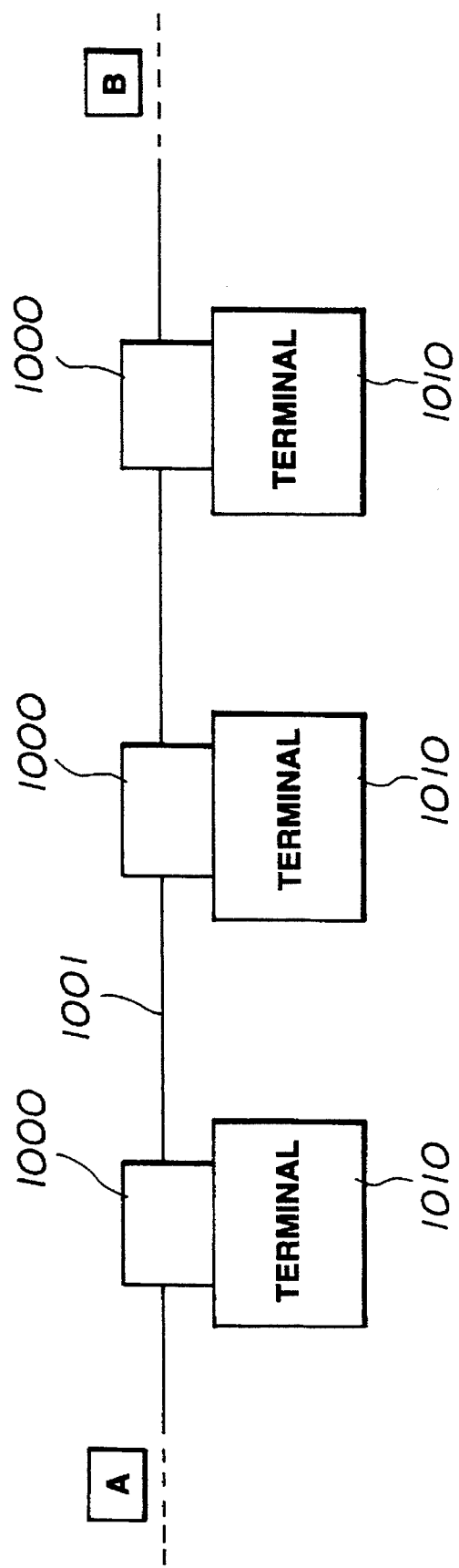

OPTICAL RECEIVER, OPTICAL SEMICONDUCTOR APPARATUS, AND OPTICAL COMMUNICATION SYSTEM UTILIZING THE SAME

BACKGROUND OF THE INVENTION

1. Field of the Invention

The present invention relates to an optical semiconductor apparatus or optical receiver which can eliminate polarization dependency and an optical communication system utilizing the same in the field of optical frequency division multiplexing communication, for example. The problem of polarization dependency arises because a receiving sensitivity fluctuates due to changes in the polarization state of signal light on the receiver side.

2. Related Background Art

In recent years, increased transmission capacity in the field of optical communications has become desirable, and the development of optical FDM communication, in which signals at a plurality of optical frequencies are multiplexed in a single optical fiber, has been advanced.

There are two kinds of optical FDM communication methods, which are classified by the type of light signal used in the receiving technique. One method is a coherent optical communication in which a beat signal is produced between signal light and light from a local oscillator to obtain an intermediate-frequency output, and that output is detected. The other method is one in which only light at a desired wavelength or optical frequency is selected by a tunable filter, and the thus-selected light is detected. The latter method, known as an optical-frequency changeable filtering method, will be described.

The tunable filter may comprise one of a Max-Zehnder type, a fiber Fabry-Perot type and an acousto-optic (AO) type, which have been respectively developed, but each has drawbacks.

In the Max-Zehnder filter type and the fiber Fabry-Perot filter type, the transmission bandwidth can be relatively freely designed and a width of several Å can be obtained, so that the frequency multiplicity of optical FDM communication can be increased. Further, there is a great advantage in that the polarization state of signal light does not adversely affect the quality of signal receiving. An example of a Max-Zehnder type filter is disclosed in K. Oda et al. "Channel Selection Characteristics of Optical FDM Filter", OCS 89-65, 1989. An example of a fiber Fabry-Perot type filter is disclosed in I. P. Kaminow et al. "FDMA-FSK Star Network with a Tunable Optical Filter Demultiplexer", IEEE J. Lightwave Technol., vol. 6, No. 9, p. 1406, September, 1988. Those filter types, however, have the disadvantages that considerable light loss exists and that downsizing of a receiver device is difficult because the integration of a semiconductor photodetector and the filter is impossible.

In the AO modulator filter type, the receiving control is easy since the transmission bandwidth is large, e.g., several tens of Å, but the multiplicity of transmitted wavelengths cannot be increased. An example of an AO modulator type filter is disclosed in N. Shimosaka et al. "A photonic wavelength division/time division hybrid multiplexed network using accoustic tunable wavelength filters for a broadcasting studio application", OCS 91-83, 1991. This filter type, however, has the drawbacks that light loss exists, that the integration with a semiconductor photodetector is impossible and that polarization control of signal light is necessary because the polarization state of signal light adversely affects the quality of signal receiving.

On the other hand, in a semiconductor filter type, e.g., a distributed feedback (DFB) filter provided with a diffraction grating formed in a light guide layer for single longitudinal mode operation, the transmission bandwidth can be narrowed (e.g., by several Å), the optical amplification function (approx. 20 dB) exists, the multiplicity of transmitted wavelengths can be increased and the minimum receiving sensitivity can be improved (i.e., the minimum receiving intensity can be reduced). An example of a semiconductor type filter is disclosed in T. Numai et al. "Semiconductor Tunable Wavelength Filter", OQE 88-65, 1988. Further, this type of filter can be formed with the same material as a semiconductor photodetector, so that integration and downsizing are feasible.

From the foregoing, the suitability of a semiconductor DFB type optical filter for optical FDM communications is clear.

The DFB filter as shown in FIG. 1, however, has polarization dependency, which results from the fact that tuned wavelength (selected wavelength of light that can be transmitted through DFB filter) for light (TE mode) having an electric field component parallel to the layer surface of the device is different from tuned wavelength for light (TM mode) having an electric field component perpendicular to the layer surface of the device. The fact is caused by the following phenomenon. Since effective indices of the waveguide for TE and TM modes are different, the Bragg conditions of the diffraction grating:

$$\lambda = 2n\Lambda/m$$

($\lambda$: wavelength of light, n: effective index, $\Lambda$: pitch of diffraction grating, m: integer or order of diffraction grating) deviate from each other between those TE and TM modes. In the filter shown in FIG. 1, there are arranged a waveguide 41, a grating 42 formed in the waveguide 41, three electrodes 43, 44 and 45 separated from each other along the light propagation direction, an active layer 46 and anti-reflection films 47 and 48 deposited on both opposite end surfaces. The electrodes 43 and 45 at opposite end portions (active regions) serve to make a gain, change the refractive index of the waveguide 41 by changing carrier densities therein and change the wavelength reflected by the grating 42 in a distributed manner. The electrode 44 at a central portion (a phase adjusting region) changes the carrier density distribution therein to control the refractive index, and thus changes the phase of light propagated through the waveguide 41 to achieve the wavelength tuning in a wider range.

In general, the index $\underline{n}$ for TM mode is smaller than the index for TE mode, and hence the tuned wavelength for TM mode is shifted toward a shorter wavelength side, compared to the tuned wavelength for TE mode. Therefore, if the tuned wavelength of DFB filter is adjusted so that its gain is maximum, for example, for TE mode, the transmission intensity of filter changes with time since the TE mode component varies when the polarization plane of signal light is rotated during transmission in the optical fiber. As a result, the received intensity varies with time, and a reduction of receiving sensitivity and an increase in error rate are caused. In the worst case, signal receiving is hardly achieved if all the signal is coupled to the DFB filter in TM mode.

SUMMARY OF THE INVENTION

It is, therefore, an object of the present invention to provide an optical semiconductor apparatus or optical receiver free from polarization dependency and an optical communication system utilizing the same.

To solve this problem of polarization dependency in a DFB filter or the like, according to the first aspect of the present invention, there is provided an optical receiver or optical semiconductor apparatus characterized by including: a pair of optical filters arranged such that tuned wavelengths for two different modes, e.g., tuned wavelengths for TE and TM modes, are set as light beams having the same wavelength; and a beam splitting path for directing a signal light to the pair of optical filters. There is also provided an optical communication system utilizing the same.

The principle of the first aspect of the present invention will be described with reference to FIG. 2 when two orthogonal modes are TE and TM modes.

If a desired signal light wavelength is defined as λb, an effective refractive index neff and a diffraction grating pitch Λ of an optical filter are determined to satisfy:

λb=2neff Λ/m

As described above, effective refractive indices neff(TE) and neff(TM) for TE mode light and TM mode light are different from each other. As shown in FIG. 2A, light having the wavelength λb can be filtered in the TE mode, while a component shifted to the short wavelength side undesirably becomes a filtering wavelength in the TM mode.

According to the present invention, signal light is split into TE mode light and TM mode light. One filter filters the TE mode light, and the other filter filters the TM mode light.

This can be achieved by two methods.

1. An effective refractive index neff1(TE) of one optical filter for the TE mode is set equal to an effective refractive index neff2(TM) of the other optical filter for the TM mode, i.e., neff1(TE)= neff2(TM).

2. The ratio of the effective refractive index of one optical filter for the TE mode to the effective refractive index of the other optical filter for the TM mode is set equal to the ratio of the reciprocal of a pitch Λ1 of the distributed feedback diffraction grating of one optical filter to that of a pitch Λ2 of the distributed feedback diffraction grating of the other optical filter, i.e., neff1(TE): neff2(TM)= 1/Λ1: 1/Λ2.

If one of the above conditions is satisfied, the wavelength λb component of the TE mode light can be filtered by one optical filter, and the wavelength λb component of the TM mode light is filtered by the other optical filter, as shown in FIGS. 2A and 2B. To realize the above methods, the following means are available.

The following means are available to realize method 1.

1-1. The widths of waveguides of the two optical filters are determined to satisfy condition neff1(TE)= neff2(TM).

1-2. The thicknesses of layers constituting the waveguides of the two optical filters are changed to satisfy condition neff1(TE)=neff2(TM).

1-3. The compositions of the layers constituting the waveguides of the two optical filters are changed to satisfy condition neff1(TE)=neff2(TM).

As for method 2, the pitches of gratings serving as diffraction gratings of the two optical filters are appropriately changed.

A beam splitter for splitting the signal light into portions for the two optical filters may be such a power splitter as a Y-beam splitting waveguide. However, if such a power splitter is employed, the TM mode light is abandoned by the filter for filtering the TE mode. Similarly, the TE mode light is abandoned by the filter for filtering the TM mode light. For this reason, if light is split into the TE and TM modes, no mode is abandoned, and filtering with a higher gain can be performed.

To solve the problem on polarization dependency as in a DFB filter, according to the second aspect of the present invention, there is provided an optical receiver or optical semiconductor apparatus wherein there are arranged an input waveguide and filter waveguide or waveguides capable of setting the tuned wavelength of one mode (e.g., TE) to be the same as the tuned wavelength of the other mode (e.g., TM) of two modes having different orders of the transverse modes (e.g., two orthogonal modes), and the input waveguide and filter waveguide are arranged to equally couple signal light to these two modes. There is also provided an optical communication system utilizing the same.

The principle of the second aspect according to the present invention will be described with reference to FIGS. 21A and 21B when the two orthogonal modes are TE and TM modes.

If a desired signal light wavelength is defined as λb, an effective diffractive index neff and a distributed feedback diffraction grating pitch Λ of an optical filter are determined to satisfy the following equation:

λb=2neff Λ/m

As described above, 0th-order transverse mode effective refractive indices neff(TE) and neff(TM) for TE mode light and TM mode light are different from each other. Light having the wavelength λb can be filtered in the TE mode, while a component shifted to the short wavelength side undesirably becomes a filtering wavelength in the TM mode.

To eliminate this drawback, according to the above proposed scheme of the present invention, signal light is coupled to the transverse modes having different orders, the TE mode light is filtered in one mode, and the TM mode light is filtered in the other mode.

FIG. 21A is a perspective view of a waveguide constituting a receiver, showing a field distribution of 0th- and 1st-order TE transverse modes. Cladding layers 902 and 903 having smaller refractive indices than that of a waveguide 901 are formed on the lower and upper surfaces of the waveguide 901. A material having a smaller refractive index than that of the waveguide 901 is buried on the right and left sides of the waveguide 901. As can be apparent from FIG. 21B, the 1st-order mode has a smaller degree of confinement in the waveguide 901 than that of the 0th-order mode. An effective refractive index neff1(TE) of the 1st-order mode is smaller than an effective refractive index neff0(TE) of the 0th-order mode. The difference between the effective refractive indices neff1(TE) and neff0(TE) depends on a waveguide width W. As shown in FIG. 21B, when the width W decreases, the difference between the effective refractive indices neff0(TE)–neff1(TE) tends to decrease because a difference in light confinement decreases with a smaller width W.

In a normal waveguide, the TM mode has a smaller degree of confinement than that of the TE mode in principle. For this reason, an effective refractive index neff0(TM) of the 0th-order transverse mode is smaller than that for the TE mode, as shown in FIG. 21B. Unlike neff1(TE), the dependency of the waveguide width W of effective refractive index neff0(TM) tends to cause a smaller difference from neff0(TE) when the width W decreases. This is because the shapes of the field distribution for TE and TM transverse modes become similar to each other when a difference between waveguide width and thickness decreases. For this reason, a waveguide width W1 which satisfies the following condition is always present:

neff1(TE)=neff0(TM)

When light is to be coupled from an input waveguide to a filter waveguide, the light is equally distributed as 0th- and 1st-order transverse modes, and the filter waveguide is set to have the width W1. Therefore, the TM mode component is filtered as the 0th-order mode, and the TE mode component is filtered as the 1st-order mode.

According to the above method, 1st-order TM mode light and 0th-order TE mode light are abandoned.

A beam splitter is arranged in the output stage of the input waveguide, and light is split into the TE and TM modes. Filter waveguides are arranged in the divided waveguides. When light guided through the divided path for selecting the TE mode is coupled to the 1st-order transverse mode of the filter waveguide, and light guided through the divided path for selecting the TM mode is coupled to the 0th-order transverse mode, no mode is abandoned, thereby achieving a filter having a higher gain.

More particularly, the object of the present invention is achieved by the following optical communication systems and apparatuses.

An optical receiver comprises a beam splitter, a plurality of waveguide type optical filters, and an opto-electric converter. Each of the optical filters has a waveguide having a distributed feedback portion constituted by a diffraction grating. Light components split by the beam splitter are coupled to the optical filters, respectively, and a tuned transmission wavelength for a TE mode light component in one of the optical filters is set equal to that for a TM mode light component in the other of the optical filters. The opto-electric converter is arranged to receive light components passing through the optical filters to convert the light components to an electric signal.

An optical semiconductor apparatus comprises beam splitting means and a plurality of optical filters. Light components split by the beam splitting means are coupled to the optical filters, respectively, and the optical filters are arranged such that a tuned transmission wavelength for a first transverse mode light component in one of the optical filters is set equal to that for a second transverse mode light component in the other of the optical filters.

An optical semiconductor apparatus comprises a first optical filter and a second optical filter. The first and second filters are arranged such that a tuned transmission wavelength for a first mode light component in the first optical filter is set equal to that for a second mode light component in the second optical filter.

An optical receiver comprises an optical input waveguide means for receiving light from outside and a filter waveguide means connected to the input waveguide means. The optical filter waveguide means has a distributed feedback portion constituted by a diffraction grating, and is constituted so that propagation constants for mutually orthogonal polarization modes having different transverse mode orders are equal to each other.

An optical receiver comprises an optical input waveguide means for receiving light from outside, a TE-TM mode splitter for splitting light from the input waveguide means into TE and TM light components, and first and second waveguide type optical filters. Each of the optical filters has a waveguide having a distributed feedback portion constituted by a diffraction grating. The TE mode light component split by the mode splitter is coupled to a first order mode of the first optical filter and the TM mode light component split by the mode splitter is coupled to a 0th order mode of the second optical filter.

An optical semiconductor apparatus comprises an optical input waveguide means for receiving light from outside, and a filter waveguide means connected to the input waveguide means. The optical filter waveguide means is constituted so that propagation constants for first and second polarization modes having different transverse mode orders are equal to each other.

An optical semiconductor apparatus comprises an optical input waveguide means for receiving light from outside, a mode splitter for splitting light from the input waveguide means into first and second mode light components, and first and second waveguide type optical filters. The first mode light component split by the mode splitter is coupled to a first order mode of the first optical filter and the second mode light component split by the mode splitter is coupled to a 0th order mode of the second optical filter.

An opto-electric conversion apparatus comprises a semiconductor laser for serving as an oscillation source and an optical receiver or semiconductor apparatus. The optical receiver or semiconductor apparatus is integrated with the semiconductor laser and has any one of the above-mentioned structures.

An optical communication system comprises a semiconductor laser for supplying a modulated signal light, an optical fiber for transmitting the signal light therethrough and an optical receiver or semiconductor apparatus for directly detecting the signal light. The optical receiver or semiconductor apparatus has any one of the above-mentioned structures.

An optical frequency division multiplexing transmission system comprises transmitting means for transmitting light components having a plurality of wavelengths modulated with a plurality of signals, an optical fiber for transmitting light therethrough, and an optical receiver or semiconductor apparatus for extracting only a signal carried on a light component having a predetermined wavelength. The optical receiver or semiconductor apparatus may have any one of the above-mentioned structures.

An optical cable television system comprises a light transmission line for transmitting signal light therethrough, an optical receiver or semiconductor apparatus disposed on a subscriber side, and an oscillation source provided on a broadcasting center for transmitting a signal to the optical receiver or semiconductor apparatus through the transmission line. line. The optical receiver or semiconductor apparatus may have any one of the above-mentioned structures.

These advantages and others will be more readily understood in connection with the following detailed description of the preferred embodiments in conjunction with the drawings.

BRIEF DESCRIPTION OF THE DRAWINGS

FIG. 19 is a view for explaining an optical LAN network;

DESCRIPTION OF THE PREFERRED EMBODIMENTS

First Embodiment

The first embodiment of the present invention will be described with reference to FIGS. 3A to 4.

Figure 1:
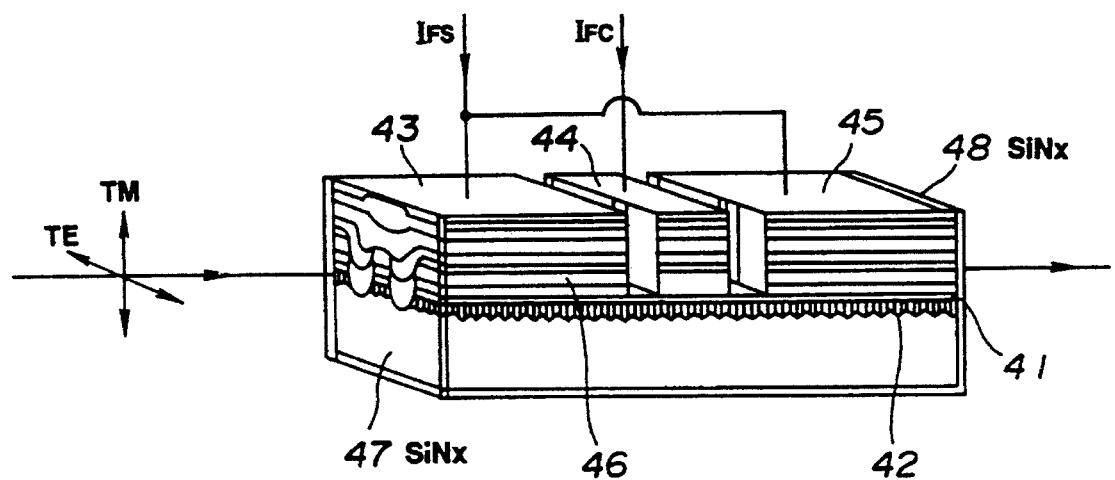
FIG. 1 is a sectional perspective view showing a DFB filter element so as to explain the prior art.
Figure 2A:
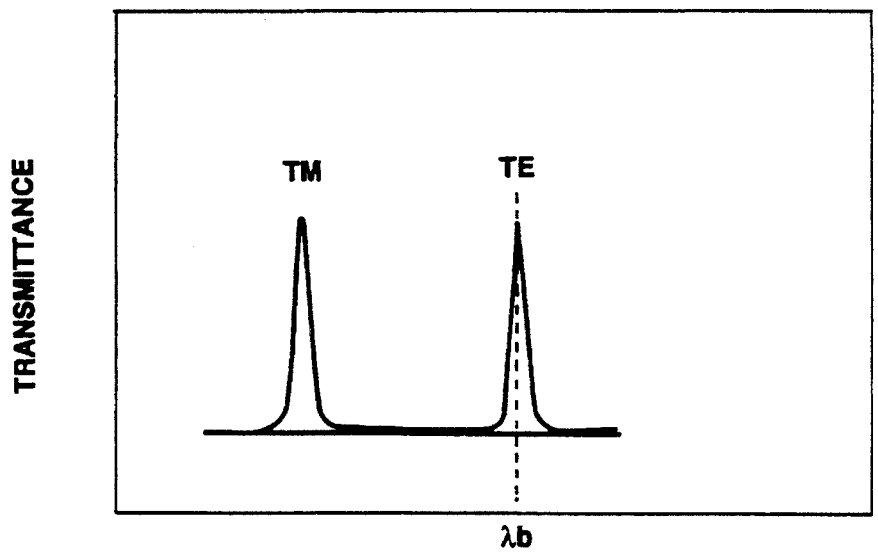
FIGS. 2A and 2B are transmission spectral charts for explaining the principle of the first aspect according to the present invention.
Figure 2B:
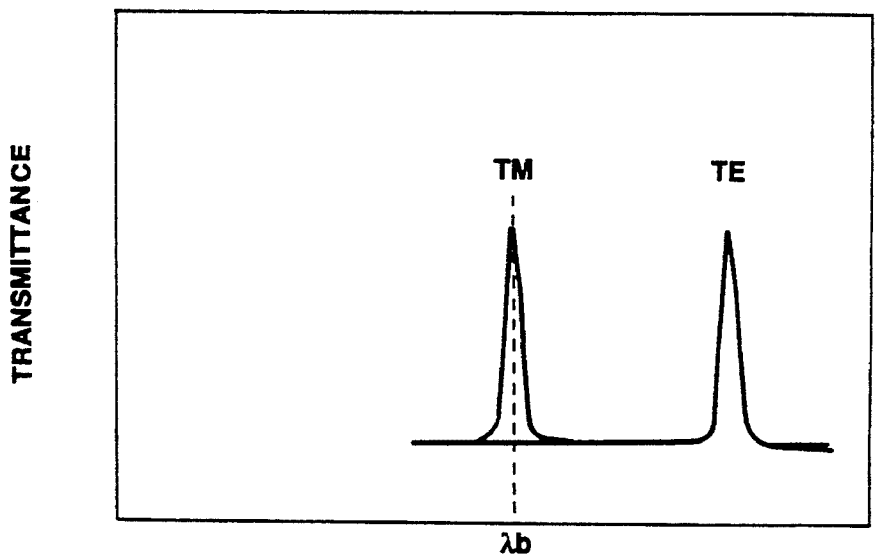
Figure 3A:
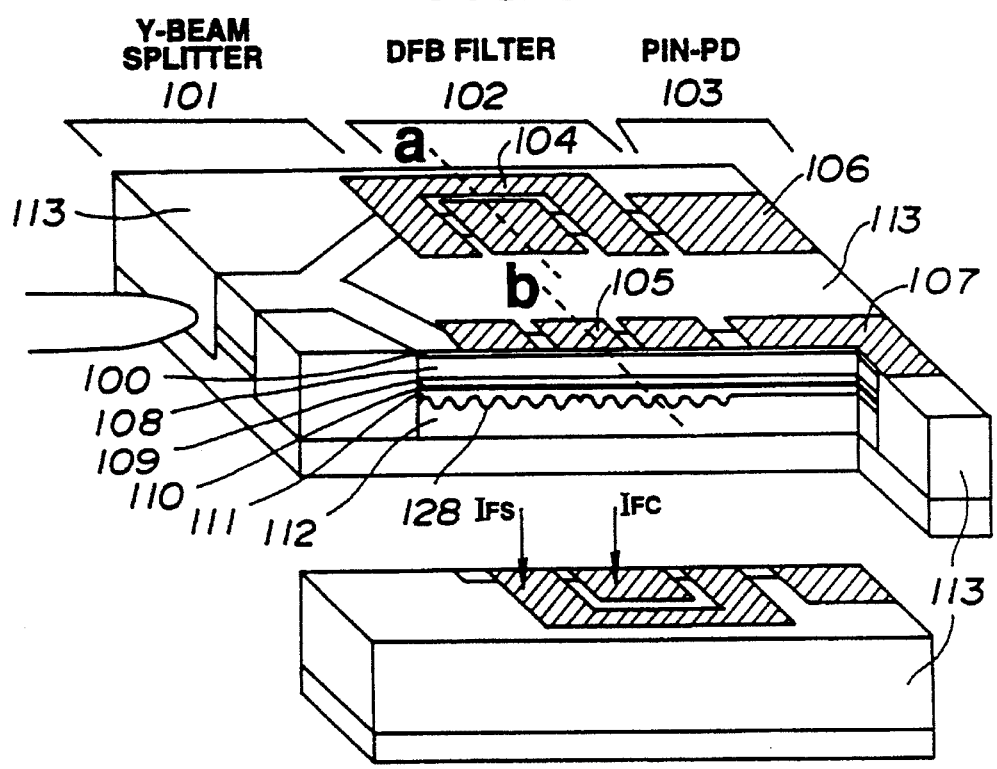
FIG. 3A is a sectional perspective view of an element according to the first embodiment of the present invention.

FIG. 3A is a sectional perspective view of an optical receiver. Reference numeral 101 denotes a Y-beam splitter; 102, a filter section constituted by two DFB filters 104 and 105; and 103, a PD section constituted by pin photodiodes (PD) 106 and 107 for detecting light components passing through the two DFB filters 104 and 105, respectively.

Currents supplied to the three-electrode tunable DFB filters 104 and 105 are two currents, i.e., a current IFS at shorted both end portions and a current IFC independent of the current IFS at the central portion. When the ratio of these two currents is controlled, the transmission wavelength can be changed while the gain and the transmission bandwidth are kept constant. A 1st-order diffraction grating 128 of the DFB filter has a/4 shift portion (it further stabilizes the single mode) at its center. The layer structure of each of the DFB filters 104 and 105 is constituted by a 0.5 μm thick p-$In_{0.59}Ga_{0.41}As_{0.9}P_{0.1}$ contact layer 100, a 1.5 μm thick p-InP upper cladding layer 108, a 0.1 μm thick $In_{0.71}Ga_{0.29}As_{0.62}P_{0.38}$ upper guiding layer 109, a 0.58 μm thick $In_{0.59}Ga_{0.41}As_{0.9}P_{0.1}$ active layer 110, a 0.2 μm thick $In_{0.71}lGa_{0.29}As_{0.62}P_{0.38}$ lower guiding layer 111 having the 0.5 μm deep diffraction grating 128, and an n-InP lower cladding layer 112. This layer structure is surrounded by high-resistance InP 113 for confinement of light and currents.

The Y-beam splitter 101 is formed such that etching is performed up to the active layer 110, and the InP cladding layer 108 is selectively grown again.

Figure 3B:
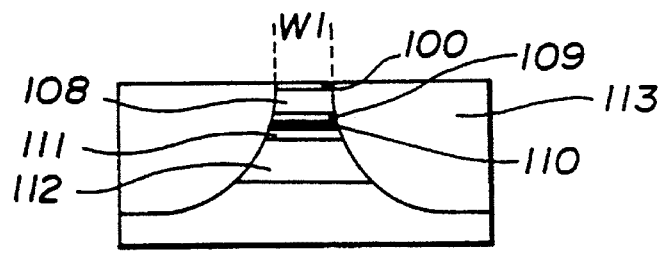
FIGS. 3B and 3C are sectional views of the element of the first embodiment.
Figure 3C:
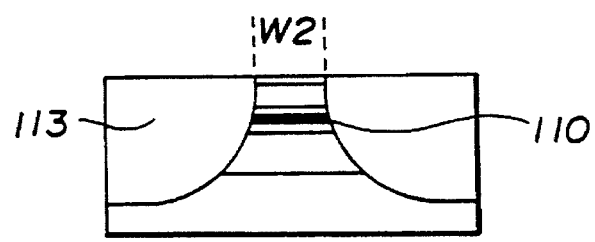

The sectional views of the two filters 104 and 105 are shown in FIGS. 3B and 3C, respectively. When the width of a mesa portion serving as a waveguide in the above structure is changed, confinement of light changes, and the effective refractive index changes accordingly. The mesa width dependency of the effective refractive indices for the TE and TM modes is as shown in FIG. 4. As can be apparent from FIG. 4, when a mesa width W1 of one DFB filter 104 and a mesa width W2 of the other DFB filter 105 are appropriately selected, the effective refractive index for the TE mode becomes equal to that for the TM mode.

Figure 4:
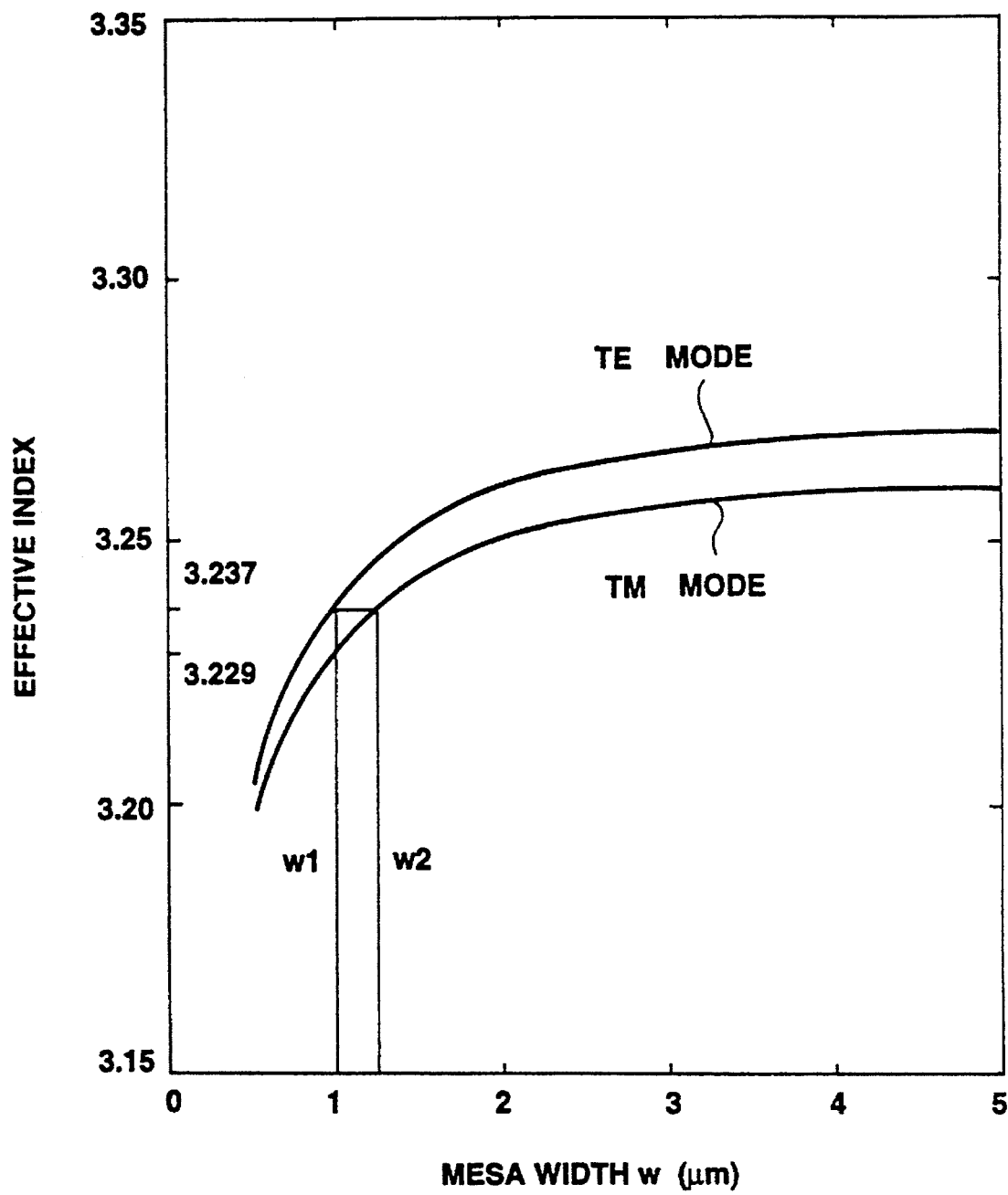
FIG. 4 is a graph showing waveguide width dependency of an effective refractive index to explain the principle of the first embodiment.

The mesa width W1 is set to 1 μm and the mesa width W2 is set to 1.24 μm from FIG. 4, and then the effective refractive index neff1(TE) for the TE mode of the DFB filter 104 is 3.237, which is equal to the effective refractive index neff2(TM) for the TM mode of the DFB filter 105.

The pitch of the diffraction grating 128 is set to 0.239 μm so as to set a transmission wavelength at 1.55 μm. Signal light is split by the optical receiver having the above structure into two portions for the DFB filters 104 and 105. The TE mode light is transmitted through the filter 104, and the TM mode light is transmitted through the filter 105. A sum of outputs upon OE (opto-electric) conversion from the PDs 106 and 107 shows that variations in outputs can be suppressed within 1 dB even if the polarization plane of the input signal light is changed.

It is difficult to make the actual mesa widths W1 and W2 accurately coincide with design values in the above structure. However, the ratio of currents flowing in the DFB filters 104 and 105 can be changed to easily tune transmission wavelengths for both the TE and TM modes.

Second Embodiment

The second embodiment of the present invention will be described with reference to FIGS. 5A to 6. The basic structure of the second embodiment is substantially the same as that of the first embodiment shown in FIGS. 3A to 3C. The basic structure of the second embodiment comprises a Y-beam splitter, a filter section constituted by two DFB filters, and a PD section constituted by two pin photodiodes (PDs) for detecting light components passing through the two DFB filters, respectively.

Figure 5A:
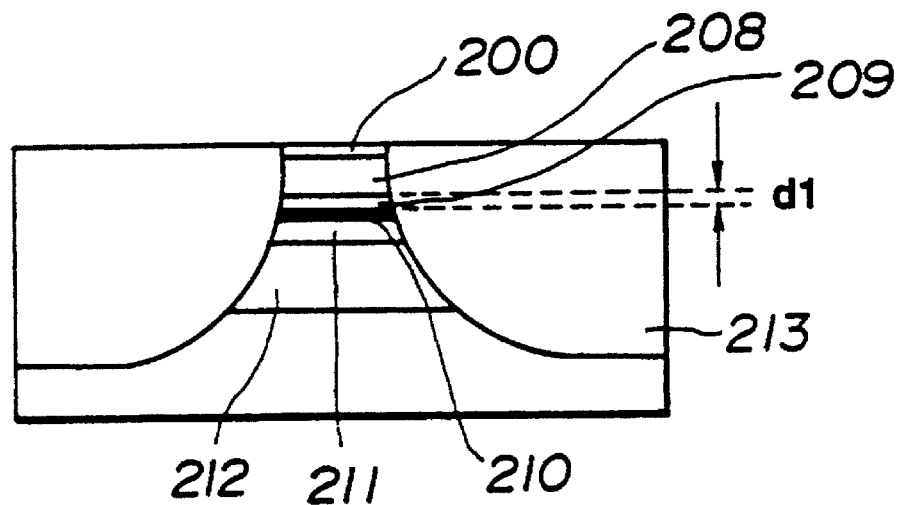
FIGS. 5A and 5B are sectional views showing an element according to the second embodiment of the present invention.
Figure 5B:
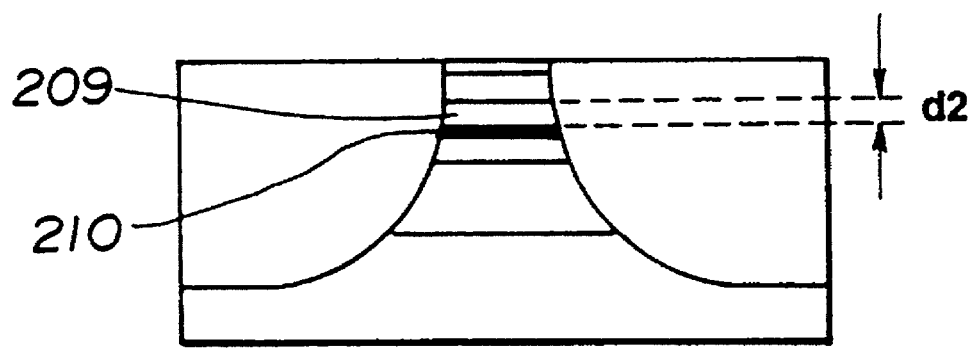

The layer structures of these two DFB filters are shown in FIGS. 5A and 5B, respectively.

The layer structure of each DFB filter is constituted by a 0.5 μm thick p-$In_{0.59}Ga_{0.41}As_{0.9}P_{0.1}$ contact layer 200, a 1.5 μm thick p-InP upper cladding layer 208, a 0.1 μm thick $In_{0.71}Ga_{0.29}As_{0.62}P_{0.38}$ upper guiding layer 209, a 0.58 μm thick $In_{0.59}Ga_{0.41}As_{0.9}P_{0.1}$ active layer 210, a 0.2 μm thick $In_{0.71}Ga_{0.29}As_{0.62}P_{0.38}$ lower guiding layer 211 having the 0.5 μm deep diffraction grating, and an n-InP lower cladding layer 212. This layer structure is surrounded by high-resistance InP 213 to form a mesa width of 1.5 μm for confinement of light and currents. Two filters have the same layer structure except that the thicknesses of the upper guiding layers 209 of the filters are different from each other.

In the above structure, when the thickness of the upper guiding layer is changed, confinement of light changes, and the effective refractive index changes accordingly. The effective index dependency on the upper guiding layer thicknesses is as shown in FIG. 6. As can be apparent from FIG. 6, when a thickness d1 of the upper guiding layer of one DFB filter and a thickness d2 of the upper guiding layer of the other DFB filter are appropriately selected, the effective refractive index for the TE mode becomes equal to that for the TM mode.

Figure 6:
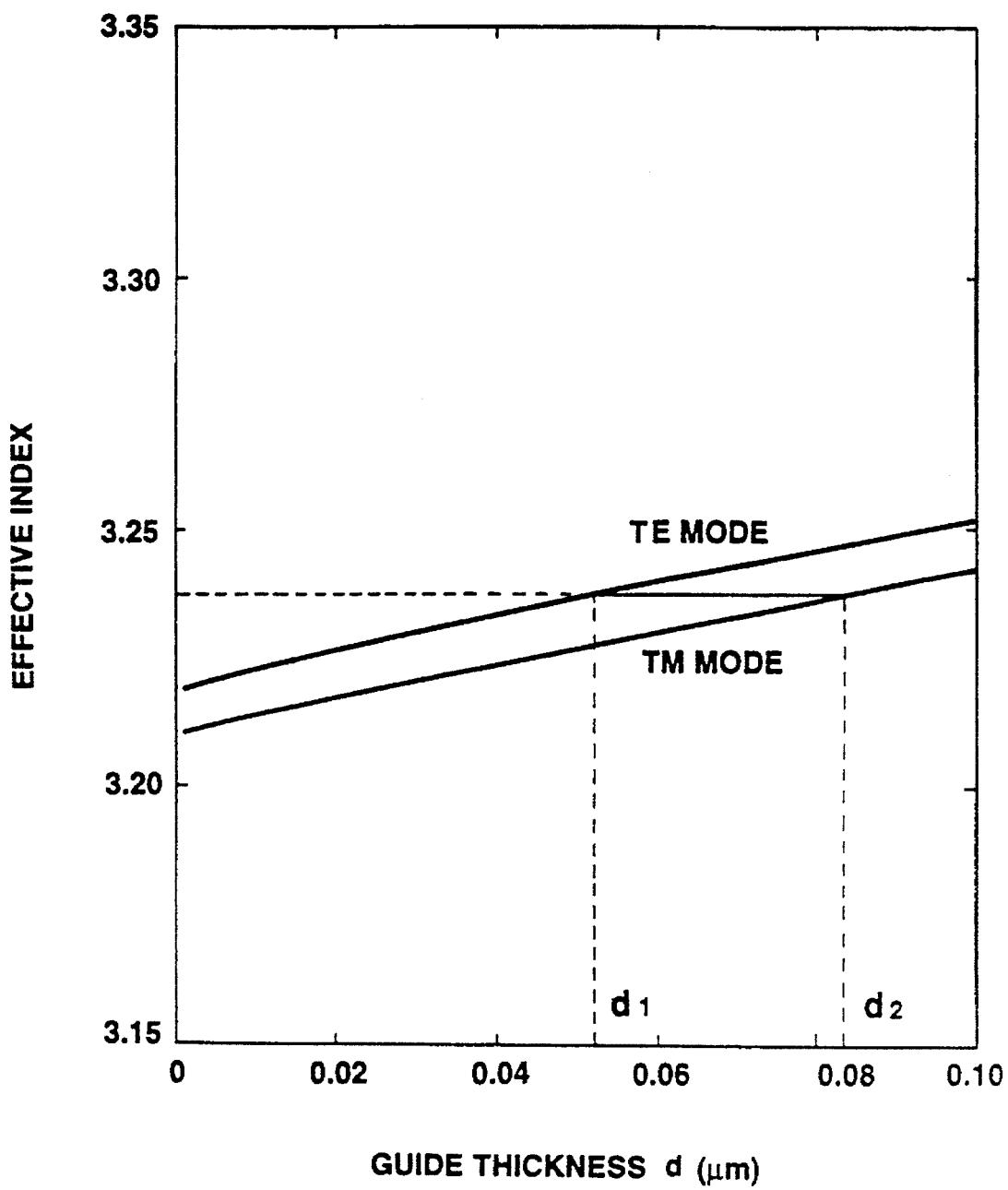
FIG. 6 is a graph showing waveguide thickness (guide thickness) dependency of an effective refractive index (effective index) to explain the principle of the second embodiment.

After the upper guiding layer of one filter a is set to 0.052 μm, the portion of the other filter is etched and a layer is selectively grown again to set the thickness d2 of the other filter at 0.083 μm, as is illustrated in FIG. 6.

At this time, the effective refractive index neff1(TE) for the TE mode of one filter is 3.237, which is equal to the effective refractive index neff2(TM) for the TM mode of the other filter. The pitch of the diffraction grating is set to 0.239 μm so as to set a transmission wavelength at 1.55 μm. Signal light is split by the optical receiver having the above structure into light portions for the DFB filters. The TE mode light is transmitted through one filter, and the TM mode light is transmitted through the other filter. A sum of outputs upon OE (opto-electric) conversion from the PD section shows that variations in outputs can be suppressed within 1 dB even if the polarization plane of the input signal light is changed.

The same effect as described above can be obtained even when the thicknesses of active layers and lower guiding layers having the diffraction gratings are changed, instead of the changes in thicknesses of the upper guiding layers as described above. However, a change in active layer thickness largely influences the laser oscillation current density of each DFB section to greatly change filter current values. In addition, a change in lower guiding layer thickness largely influences the coupling coefficient of the distributed feedback of DFB, and the pass bandwidth is undesirably changed. Therefore, the thicknesses of the upper guiding layers are changed herein.

It is difficult to make the actual mesa widths W1 and W2 accurately coincide with design values in the manufacture according to the first embodiment. In this embodiment, the design layer thicknesses can be easily obtained because the layer thicknesses are controlled by crystal growth.

Third Embodiment

The third embodiment of the present invention will be described with reference to FIGS. 7A to 8. The basic structure of the third embodiment is substantially the same as that of the first embodiment shown in FIGS. 3A to 3C. The basic structure of the third embodiment comprises a Y-beam splitter, a filter section constituted by two DFB filters, and a PD section constituted by two pin photodiodes (PDs) for detecting light components passing through the two DFB filters, respectively.

Figure 7A:
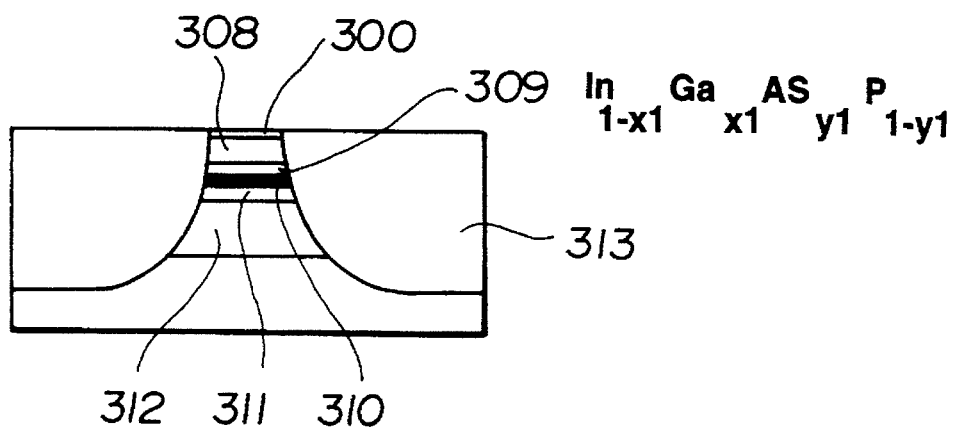
FIGS. 7A and 7B are sectional views showing an element according to the third embodiment of the present invention.
Figure 7B:
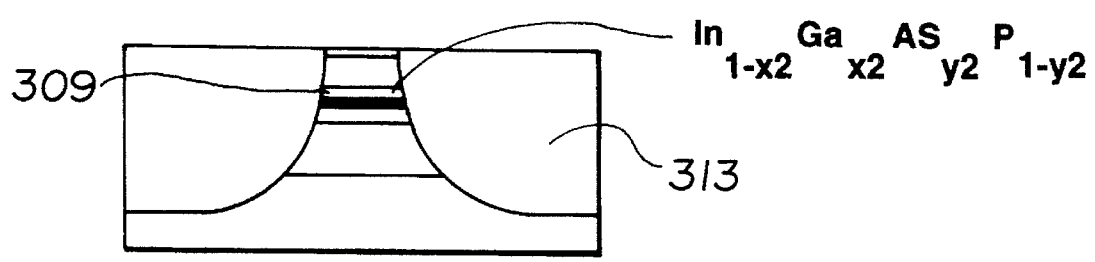

The layer structures of these two DFB filters are shown in FIGS. 7A and 7B, respectively.

The layer structure of each DFB filter is constituted by a 0.5 μm thick p-$In_{0.59}Ga_{0.41}As_{0.9}P_{0.1}$ contact layer 300, a 1.5 μm thick p-InP upper cladding layer 308, a 0.1 μm thick $In_{1-x}Ga_xAs_yP_{1-y}$ upper guiding layer 309, a 0.58 μm thick $In_{0.59}Ga_{0.41}As_{0.9}P_{0.1}$ active layer 310, a 0.2 μm thick $In_{0.71}Ga_{0.29}As_{0.62}P_{0.38}$ lower guiding layer 311 having the 0.5 μm deep diffraction grating, and an n-InP lower cladding layer 312. This layer structure is surrounded by high-resistance InP 313 to form a mesa width of 1.5 μm for confinement of light and currents. Two filters have the same layer structure except that the compositions of the upper guiding layers of the filters are different from each other.

In the above structure, when the composition of the upper guiding layer is changed, the refractive index and confinement of light change, and the effective refractive index changes accordingly. The effective index dependency on the upper guiding layer refractive index ng is as shown in FIG. 8. As can be apparent from FIG. 8, when a refractive index ng1 of the upper guiding layer of one DFB filter and a refractive index ng2 of the upper guiding layer of the other DFB filter are appropriately selected, the effective refractive index for the TE mode becomes equal to that for the TM mode.

Figure 8:
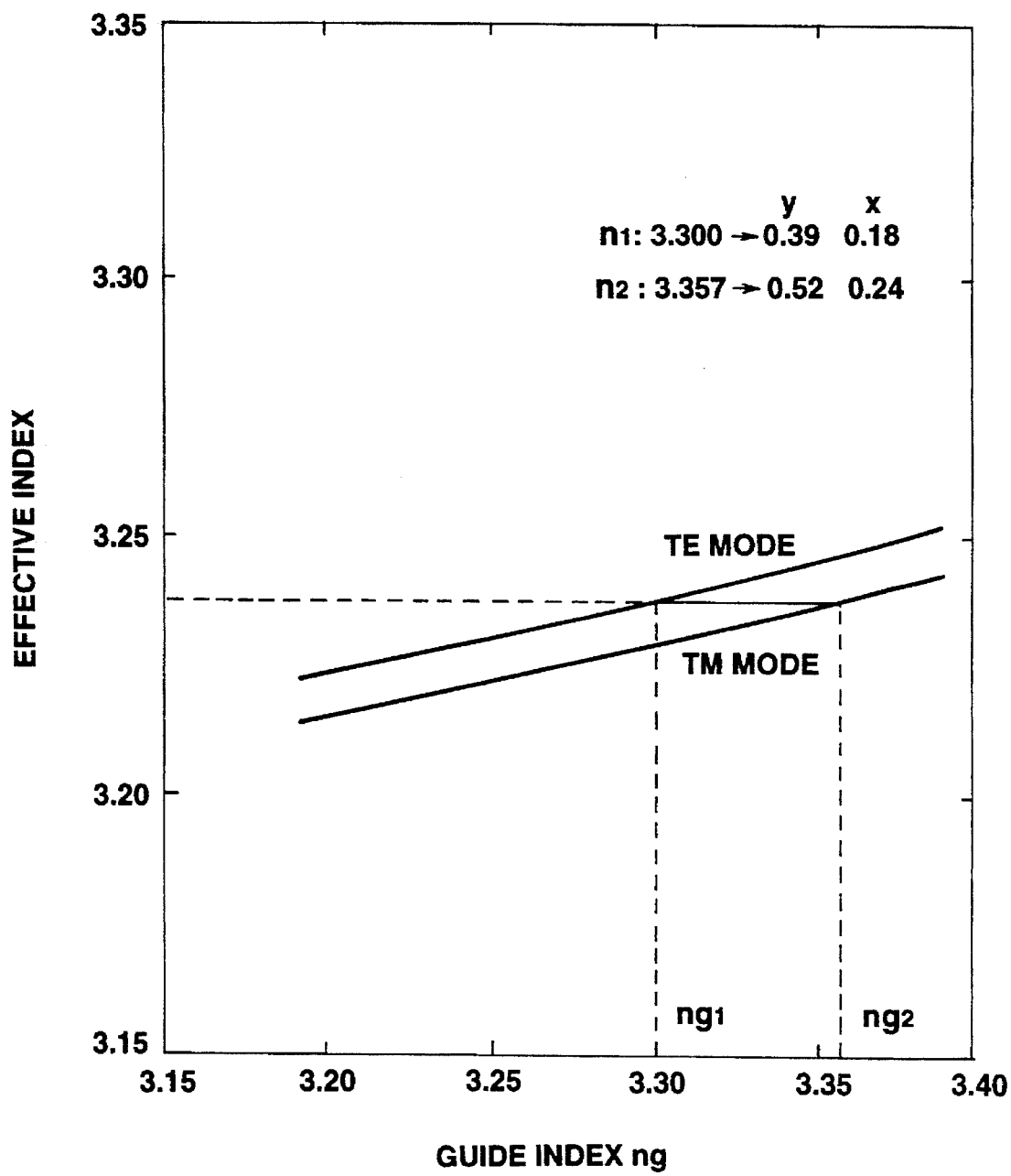
FIG. 8 is a graph showing waveguide refractive index (guide index) dependency of an effective refractive index to explain the principle of the third embodiment.

In this case, to cause the effective refractive index for the TE mode to coincide with the effective refractive index for the TM mode by setting the refractive index ng1 of 3.30, and the refractive index ng2 of 3.36 from FIG. 8, the compositions of the upper guiding layers of the two filters are given as $In_{0.82}Ga_{0.18}As_{0.39}P_{0.61}$ and $In_{0.76}Ga_{0.24}As_{0.52}P_{0.48}$, respectively. After the layer of one filter is grown, a portion corresponding to the other filter is etched, and the layer of the other filter is grown by selective regrowth. An effective refractive index neff1(TE) for the TE mode of one filter is set to 3.237, which is equal to an effective refractive index neff2(TM) for the TM mode of the other filter. The pitch of the diffraction grating is set to 0.239 μm so as to set a transmission wavelength at 1.55 μm. Signal light is split by the optical receiver having the above structure into light portions for the DFB filters. The TE mode light is transmitted through one filter, and the TM mode light is transmitted through the other filter. A sum of outputs upon OE (opto-electric) conversion from the PD section shows that variations in outputs can be suppressed within 1 dB even if the polarization plane of the input signal light is changed.

The same effect as described above can be obtained even when the compositions of active layers and lower guiding layers having the diffraction gratings are changed, instead of the changes in compositions of the upper guiding layers as described above. However, a change in active layer composition largely influences the laser oscillation current density of each DFB section to greatly change filter current values. In addition, a change in lower guiding layer composition largely influences the coupling coefficient of the distributed feedback of DFB, and the pass bandwidth is undesirably changed. Therefore, the thicknesses of the upper guiding layers are changed in this embodiment.

It is difficult to make the actual mesa widths W1 and W2 accurately coincide with design values in the manufacture according to the first embodiment. In this embodiment, the design layer thicknesses can be easily obtained because the layer thicknesses are controlled by crystal growth.

Fourth Embodiment

The fourth embodiment of the present invention will be described with reference to FIGS. 4 and 9A to 9C.

Figure 9A:
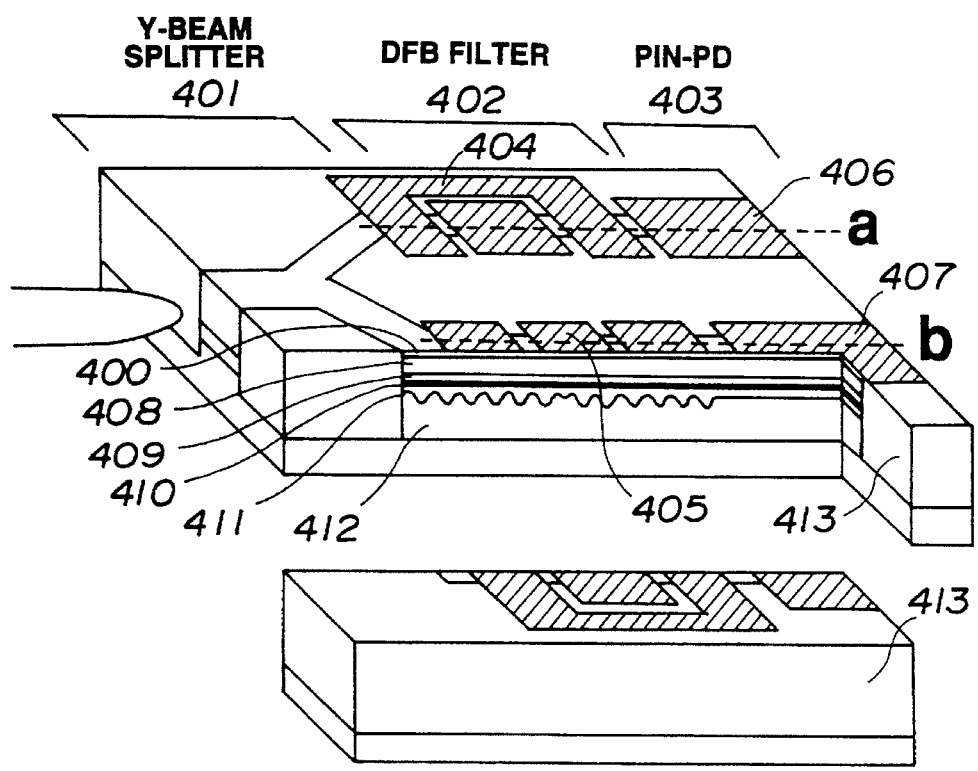
FIG. 9A is a sectional perspective view of an element according to the fourth embodiment of the present invention.

FIG. 9A is a sectional perspective view of an optical receiver of this embodiment. Reference numeral 401 denotes a Y-beam splitter; 402, a filter section constituted by two distributed feedback type (DFB) filters 404 and 405; and 403, a PD section constituted by pin photodiodes (PD) 406 and 407 for detecting light components passing through the two DFB filters 404 and 405, respectively.

Figure 9B:
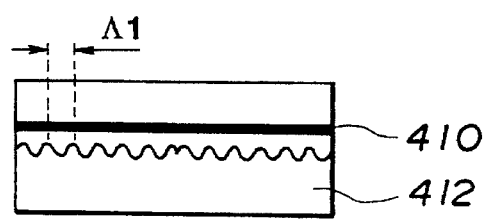
FIGS. 9B and 9C are sectional views of the element of the fourth embodiment.
Figure 9C:
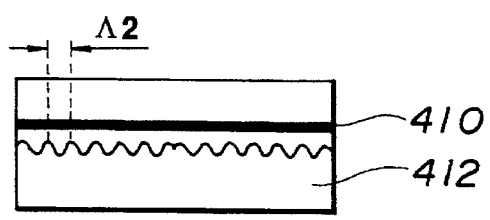

The tunable DFB filters 404 and 405 are three-electrode filters, respectively. Currents supplied to the three-electrode tunable DFB filters 404 and 405 are two currents, i.e., a current IFS at shorted both end portions and a current IFC independent of the current IFS at the central portion. When the ratio of these two currents is controlled, the transmission wavelength can be changed while the gain and the transmission bandwidth are kept constant. A 1st-order diffraction grating of the DFB filter has a/4 shift portion at the center thereof. The layer structure of each of the DFB filters 404 and 405 is constituted by a 0.5 μm thick p-$In_{0.59}Ga_{0.41}As_{0.9}P_{0.1}$ contact layer 400, a 1.5 μm thick p-InP upper cladding layer 408, a 0.1 μm thick $In_{0.71}Ga_{0.29}As_{0.62}P_{0.38}$ upper guiding layer 409, a 0.58 μm thick $In_{0.59}Ga_{0.41}As_{0.9}P_{0.1}$ active layer 410, a 0.2 μm thick $In_{0.71}Ga_{0.29}As_{0.62}P_{0.38}$ lower guiding layer 411 having a 0.5 μm deep diffraction grating 428, and an n-InP lower cladding layer 412. This layer structure is surrounded by high-resistance InP 413 to form a mesa width of 1.0 μm for confinement of light and currents. The sectional views of the two filters 404 and 405 are shown in FIGS. 9B and 9C, respectively. The mesa width dependency of the effective refractive indices for the TE and TM modes in the waveguides having the above structure is as shown in FIG. 4. As can be apparent from FIG. 4, when the mesa width of the DFB filter is set to 1 μm, the effective refractive index neff(TE) is 3.237, and the effective refractive index neff(TM) is 3.229. If the diffraction grating pitches of one DFB filter 404 and the other DFB filter 405 are defined as Λ1 and Λ2, respectively, the pitches Λ1 and Λ2 are determined to satisfy condition neff(TE) Λ1=neff(TM) Λ2. A resonance wavelength λb (=2neff Λ/m) for the TE mode is then apparently equal to that for the TM mode.

The pitches of the diffraction gratings of one filter 404 and the other filter 405 are set to 0.2394 μm and 0.2400 μm so as to set a transmission wavelength of 1.55 μm.

Signal light is split by the optical receiver having the above structure into lights for the DFB filters 404 and 405. The TE mode light is transmitted through the filter 404, and the TM mode light is transmitted through the filter 405. A sum of outputs upon OE conversion from the PDs 406 and 407 exhibits that variations in outputs can be suppressed within 1 dB even if the polarization plane of the input signal light is changed.

In each of the first to fourth embodiments, the Y-beam splitter is used as a means for splitting input light into two lights for filters. However, a slit mirror type splitting coupler may be used in place of the Y-beam splitter to obtain the same effect.

Fifth Embodiment

In each of the first to fourth embodiments, input signal light is split into two filters by the Y-beam splitter, and the pin-PDs are arranged corresponding to the optical filters, respectively. However, in the fifth embodiment, an optical multiplexer for combining or multiplexing light components passing through the optical filters is arranged at the outputs of the optical filters, so that input signal light can be received by one PD.

Figure 10:
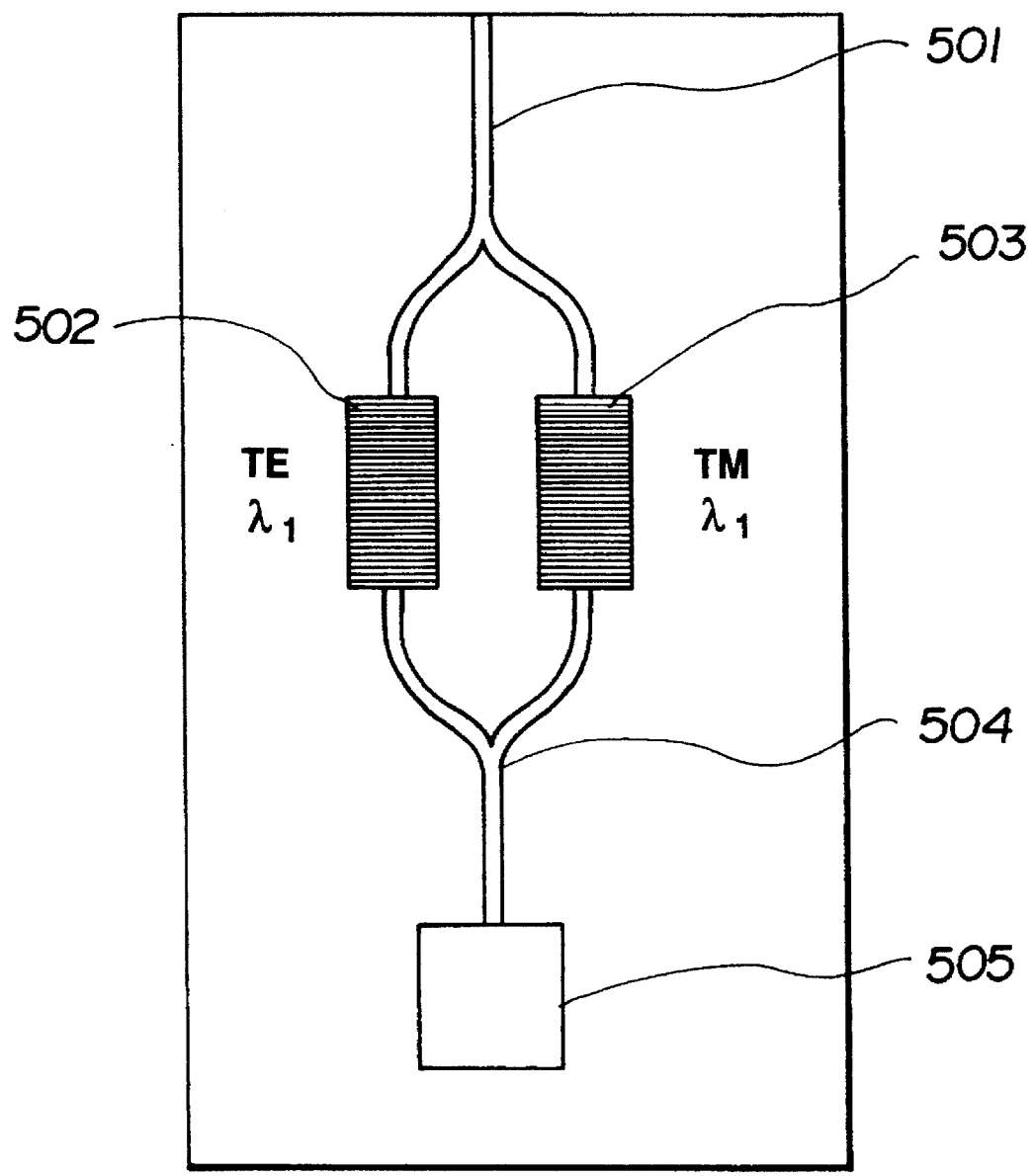
FIG. 10 is a plan view of an element according to the fifth embodiment of the present invention.

The fifth embodiment of the present invention will be described with reference to FIG. 10. FIG. 10 is a plan view of an optical receiver. Reference numeral 501 denotes a Y-beam splitter; 502 and 503, two DFB filters; 504, a Y-multiplexer for multiplexing the light components passing through the two DFB filters; and 504, a PD section constituted by a pin photodiode (PD) for detecting the multiplexed light.

The filters 502 and 503 may have any arrangement as described in the first to fourth embodiments.

If the filtering wavelength for the TE mode in the filter 502 is set equal to that for the TM mode in the filter 503 in accordance with the same technique as in the first to fourth embodiments, the filtering wavelengths remain the same even if the polarization plane of the input signal light is rotated. Therefore, reception can be performed without variations in light outputs passing through the filter section.

A peripheral electric circuit for OE conversion can be advantageously simplified because only one PD is used. In this case, the optical multiplexer is a power multiplexer, but may be a polarization multiplexer for multiplexing the TE and TM modes.

Sixth Embodiment

In each of the first to fourth embodiments, input signal light is split into lights for two filters by a Y-beam splitter, and the Y-beam splitter is a power splitter. In this embodiment, a Y-beam splitter has a TE/TM mode splitting function, and gain efficiency of the filter is improved.

The sixth embodiment of the present invention will be described with reference to FIG. 11.

Figure 11:
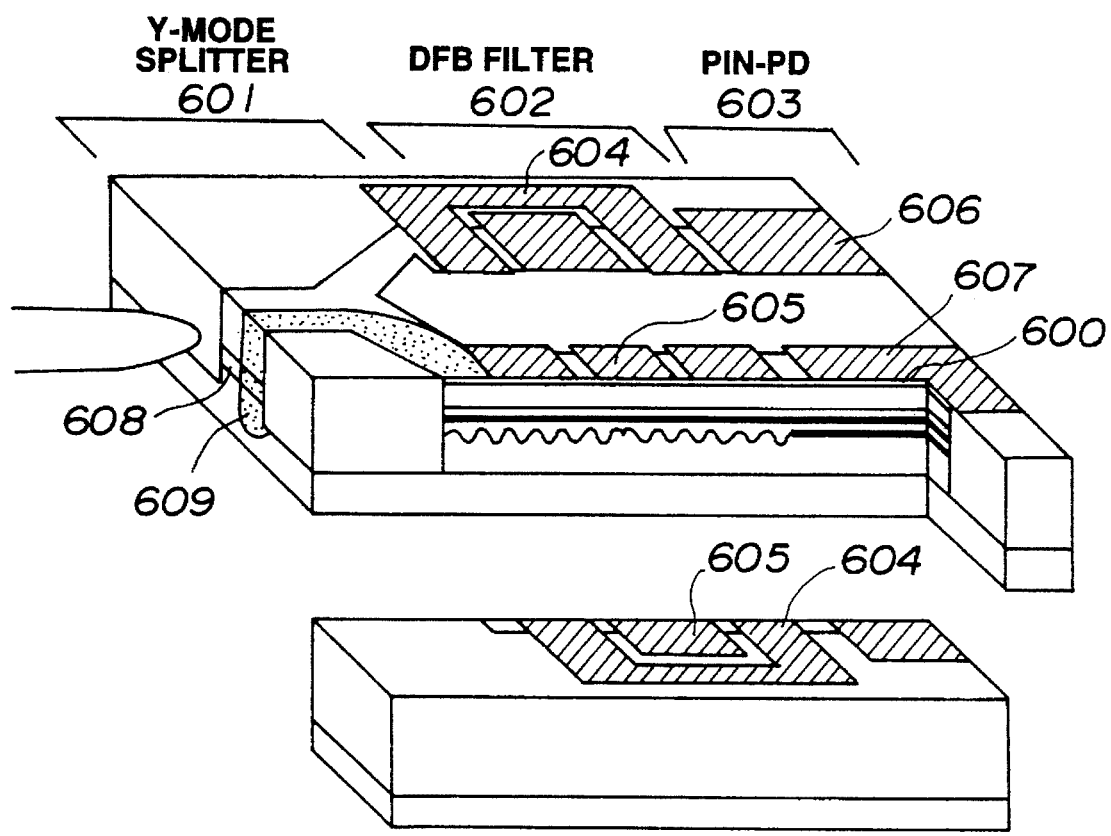
FIG. 11 is a sectional perspective view showing an element according to the sixth embodiment of the present invention.

FIG. 11 is a sectional perspective view of an optical receiver. Reference numeral 601 denotes a Y-mode splitter; 602, a filter section constituted by two DFB filters 604 and 605; and 603, a PD section constituted by pin photodiodes (PDs) 606 and 607 for detecting light components passing through the two DFB filters.

The filter section 602 may have any arrangement as described in the first to fourth embodiments. The PD section 603 may have any arrangement described in the first to fourth embodiments or the fifth embodiment.

The Y-mode splitter 601 has a waveguide 608. In each of the first to fifth embodiments, the waveguide is a bulk path obtained by selective regrowth. However, in this embodiment, the waveguide has a multiple quantum well (MQW) structure. Reference numeral 609 denotes a selective mixed crystal region. Part of the waveguide 608 is converted into a mixed crystal region by cap annealing, and the TM mode light tends to be coupled to the mixed crystal region 609, while the TE mode light tends not to be coupled to the mixed crystal region 609.

Of the input signal light components, the TE mode is coupled to the waveguide not containing a mixed crystal and is received by the PD 606 through the filter 604. The TM mode is coupled to the mixed crystal region 609 of the waveguide 608 and is received by the PD 607 through the filter 605.

If the filtering wavelength for the TE mode in the filter 604 is set equal to that for the TM mode in the filter 605 in accordance with the same means as in the first to fourth embodiments, the filtering wavelengths remain the same even if the polarization plane of the input signal light is rotated. Reception free from variations in light outputs passing through the filter section 602 can be performed.

In each of the first to fourth embodiments, the splitter for splitting signal light into two filters is a power splitter. With this arrangement, the TM mode light is abandoned in the filter for filtering the TE mode. Similarly, the TE mode light is abandoned in the filter for filtering the TM mode. In this sense, there are signal light components lost in the filters.

In this embodiment, splitting is performed by TE/TM mode splitting, and no modes abandoned by the filters are present. Filtering with a higher gain can be achieved.

The above embodiments exemplify 1.55 μm band materials. However, similar means can be applied even in use of 1.3- and 0.6 μm band (GaAs-/AlGaAs-based materials).

In each of the above embodiments, a DFB filter having a distributed feedback region is exemplified as an optical filter. However, a DBR filter in which a distributed reflector region and an active region are separated from each other can be used to obtain the same effect as described above.

Seventh Embodiment

Figure 12:
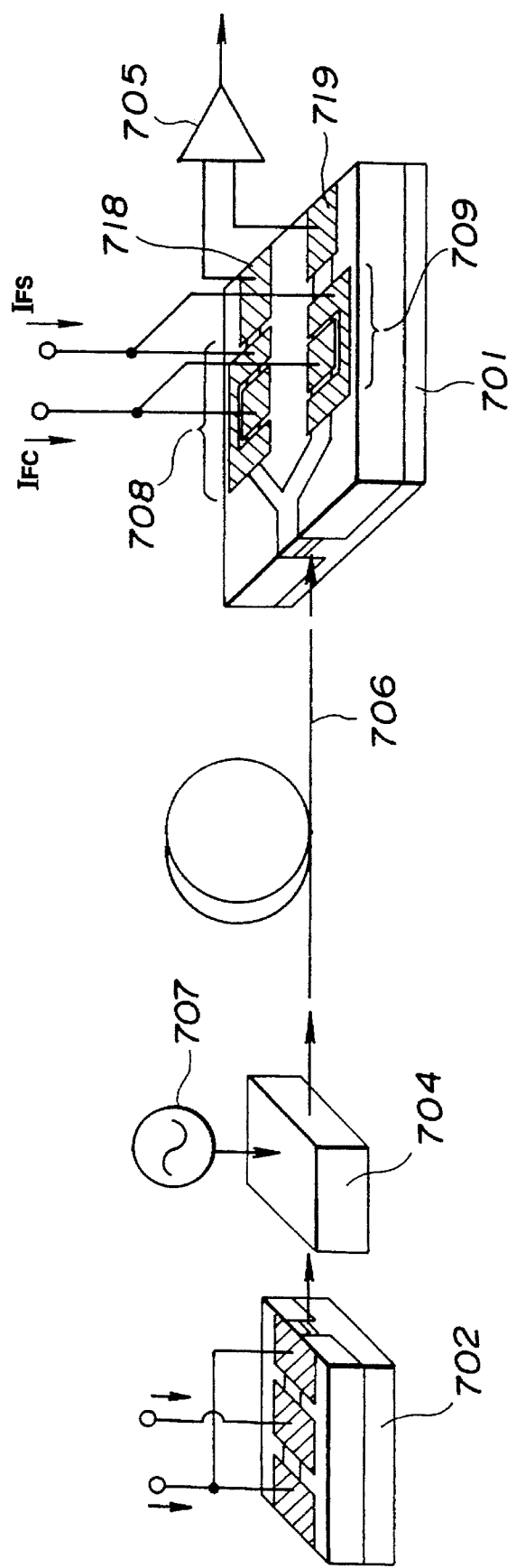
FIG. 12 is a view for explaining an optical communication system according to the sixth embodiment of the present invention.

The seventh embodiment using an apparatus of the present invention to perform optical transmission will be described with reference to FIG. 12.

Figure 13:
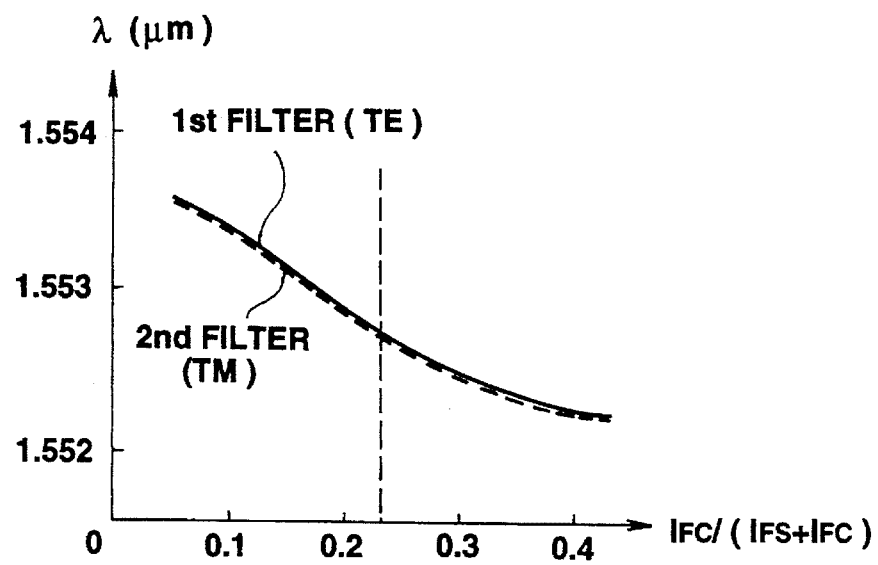
FIGS. 13A and 13B are graphs for explaining characteristics of a DFB filter.
Figure 13:
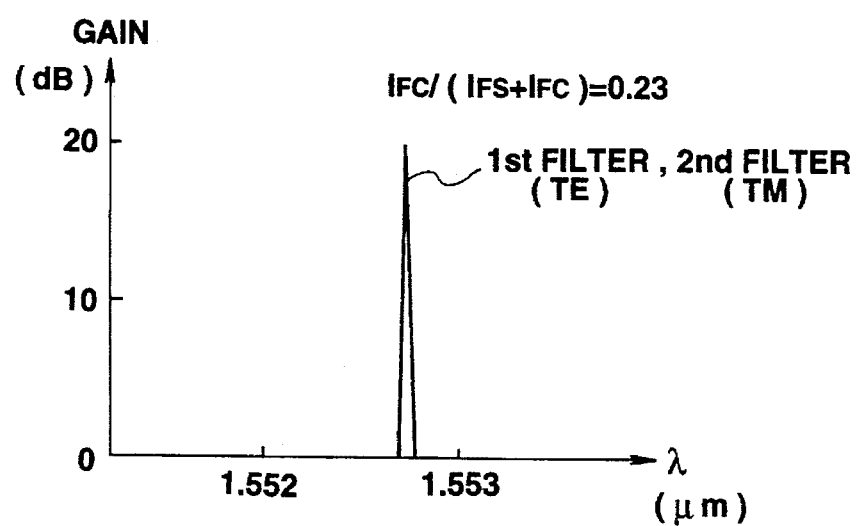

Reference numeral 701 denotes an optical receiver of the present invention. This optical receiver may be any one of the receivers of the first to sixth embodiments. Currents flowing through two DFB filters 708 and 709 constituting the optical receiver 701 are two, i.e., a current IFS flowing in two short-circuited end portions, and a current IFC flowing in the central portion independently of the current IFS. When the ratio of these two currents is controlled, the transmission wavelength can be changed while the gain and the transmission bandwidth are kept constant. The wavelength dependency of transmission characteristics is shown in FIGS. 13A and 13B. The relationship between the current ratio (IFC/(IFS+IFC)) and the transmission wavelength indicates that the wavelength for the TE mode light selected by the first filter is almost equal to the wavelength for the TM mode light selected by the second filter, as shown in FIG. 13A, because the wavelengths for the TE and TM modes which are selected by the two filters 708 and 709 are designed to be equal to each other, as described in the first to sixth embodiments. As described above, current control can be commonly performed in the two filters 708 and 709.

As shown in FIG. 13B, the transmission bandwidth is 0.03 nm at level where the gain is decreased by 10 dB. The characteristics are kept almost constant within a range of about 1 nm between the selected wavelengths of 1.5535 μm to 1.5525 μm.

Referring back to FIG. 12, reference numeral 702 denotes a three-electrode tunable DFB laser having almost the same structure as that of the DFB filter. This laser may be of a DBR type. The oscillation wavelength has a tunable width of about 1.5 nm obtained by changing the current ratio within the range of 0.1 to 0.6 as in a DFB filter while maintaining a single mode. The light is caused to become incident on a modulator 704, and the modulator 704 is driven with a modulation signal 707 to perform optical intensity modulation. In this embodiment, to suppress wavelength variations (chirping) during intensity modulation, a Max-Zehnder modulator consisting of LN (lithium niobate; $LiNbO_3$) is used. However, a semiconductor field absorption type modulator or a modulator integration type laser may be used in place of the Max-Zehnder modulator.

Modulated light is coupled to and transmitted through an optical fiber 706. The optical fiber 706 is a 1.55 μm band dispersion shift single mode fiber. In transmission of light in the bands of 1.3 and 0.8 μm, appropriate optical fibers are respectively used.

Figure 14:
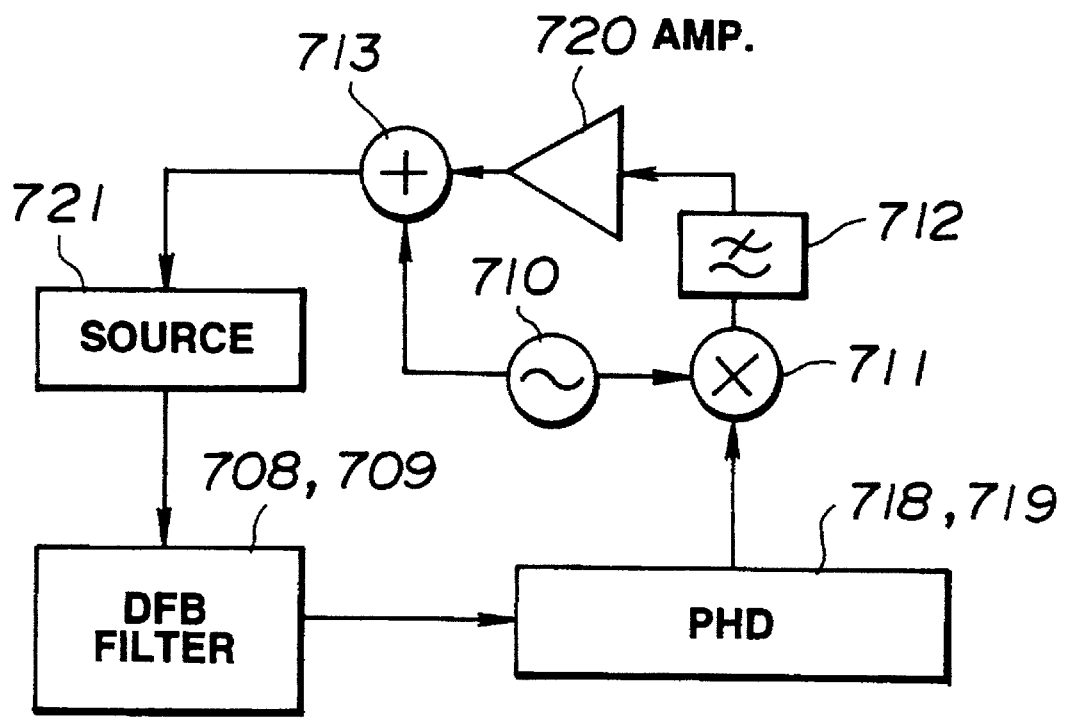
FIG. 14 is a block diagram of a system for stabilizing the wavelength of the DFB filter.

In this optical transmission system, when a signal is to be received by the optical fiber 701, the transmission wavelengths of the filters 708 and 709 are tuned to desired positions, and a sum of outputs from two photodetectors 718 and 719 integrated and connected to outputs of the filters 708 and 709 is obtained by an addition amplifier 705. At this time, it is difficult to cause the transmission peaks of the filters 708 and 709 to stably coincide with a desired wavelength in accordance with only element temperature control. For this reason, stable control is performed using a circuit diagram in FIG. 14, and its principle will be briefly described. DFB filter 708 or 709 is slightly modulated with a low-frequency sinusoidal wave (10 kHz) by an oscillator 710 through an adder 713. The low-frequency sinusoidal wave is mixed with an electrical signal received by the photodetector 718 or 719 by a multiplier 711. A low-frequency component is extracted from an output signal from the multiplier 711 by a low-pass filter 712 (cutoff frequency: 100 Hz). The extracted low-frequency component is amplified by an amplifier 720. The amplified signal is negatively fed back to the DC component of a current source 721. Therefore, the transmission peak of the DFB filters 708 and 709 can be tuned to the wavelength of the laser beam in the band from the DC to the 100-Hz.

In transmission performed by the above method, even if a polarization control element is inserted in the optical fiber 706 to intentionally rotate the polarization plane, the error rate remained almost the same as about $10^{-9}$ at a reception sensitivity of −26 dBm.

Figure 15:
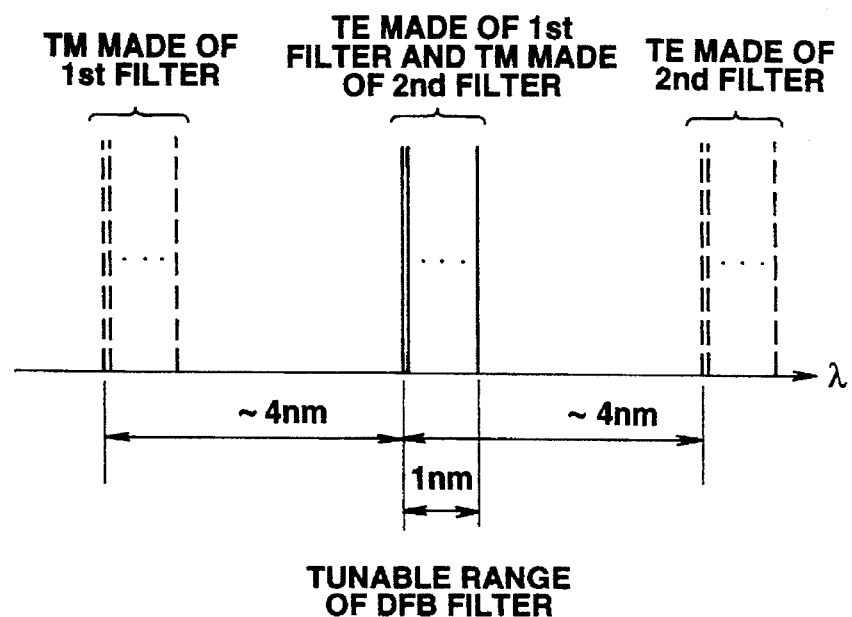
FIG. 15 is a view for explaining an optical frequency division multiplexing method.

An optical frequency division multiplexing method for performing optical transmission using the above method will be described with reference to FIG. 15. Crosstalk caused by light supposed to be normally abandoned, i.e.,by the TM mode light abandoned by the first filter and the TE mode light abandoned by the second filter, should be taken into consideration. In the filter 708, the tuned wavelength for the TM mode is shifted from the tuned wavelength for the TE mode by about 4 nm on the short-wavelength side, as indicated by broken lines in FIG. 14. Similarly, in the filter 709, the tuned wavelength for the TE mode is shifted from the tuned wavelength for the TM mode by about 4 nm on the long-wavelength side, as indicated by broken lines in FIG. 14. For these reasons, those tuned wavelengths fall outside the 1 μm tunable range of the DFB filter and do not become crosstalk factors. To realize frequency division multiplexing with a crosstalk of 10 dB, if multiplexing is performed at a wavelength interval of about 0.03 nm, 1 nm/0.03 nm=33, i.e., multiplexing transmission using about 30 channels can be realized because the 10-dB down level transmission bandwidth of the DFB filter is 0.03 nm, as described above.

Eighth Embodiment

Figure 16:
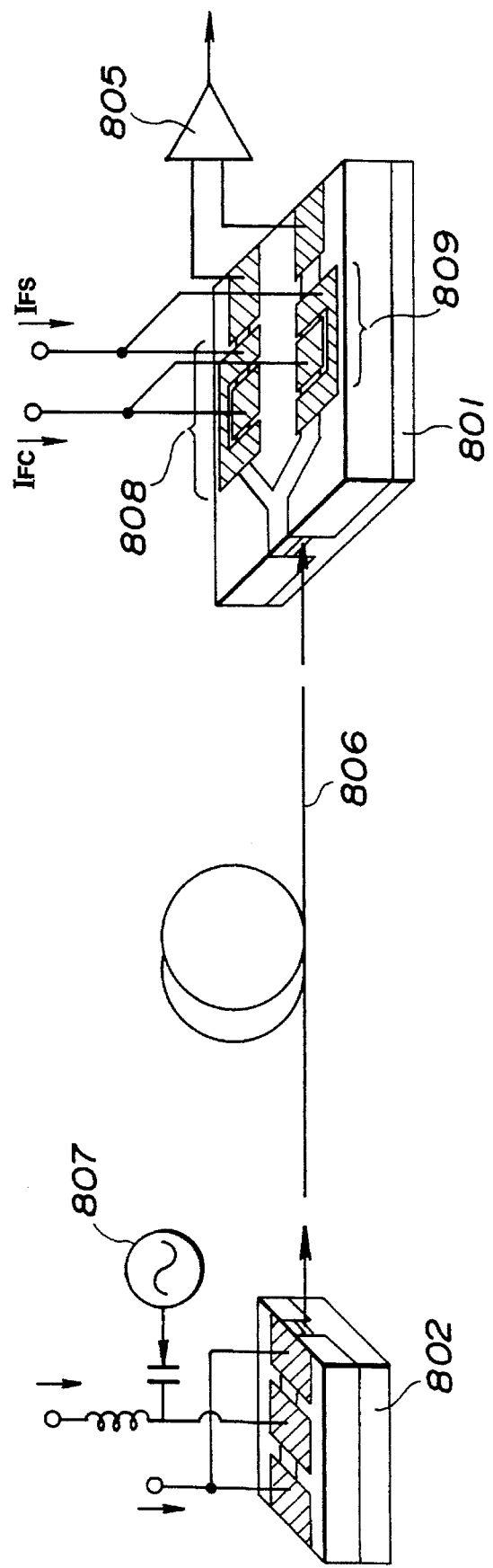
FIG. 16 is a view for explaining an optical communication system according to the eighth and ninth embodiments.

FIG. 16 is a view for explaining an optical transmission system according to the eighth embodiment of the present invention. Although intensity modulation using an external modulator is performed in the seventh embodiment, a laser 802 is directly frequency-modulated in the eighth embodiment. A modulation signal 807 is superposed on a bias current injected in the central electrode of the laser 802 to easily perform frequency modulation. In code transmission, FSK (Frequency Shift Keying) modulation may be performed.

Figure 17:
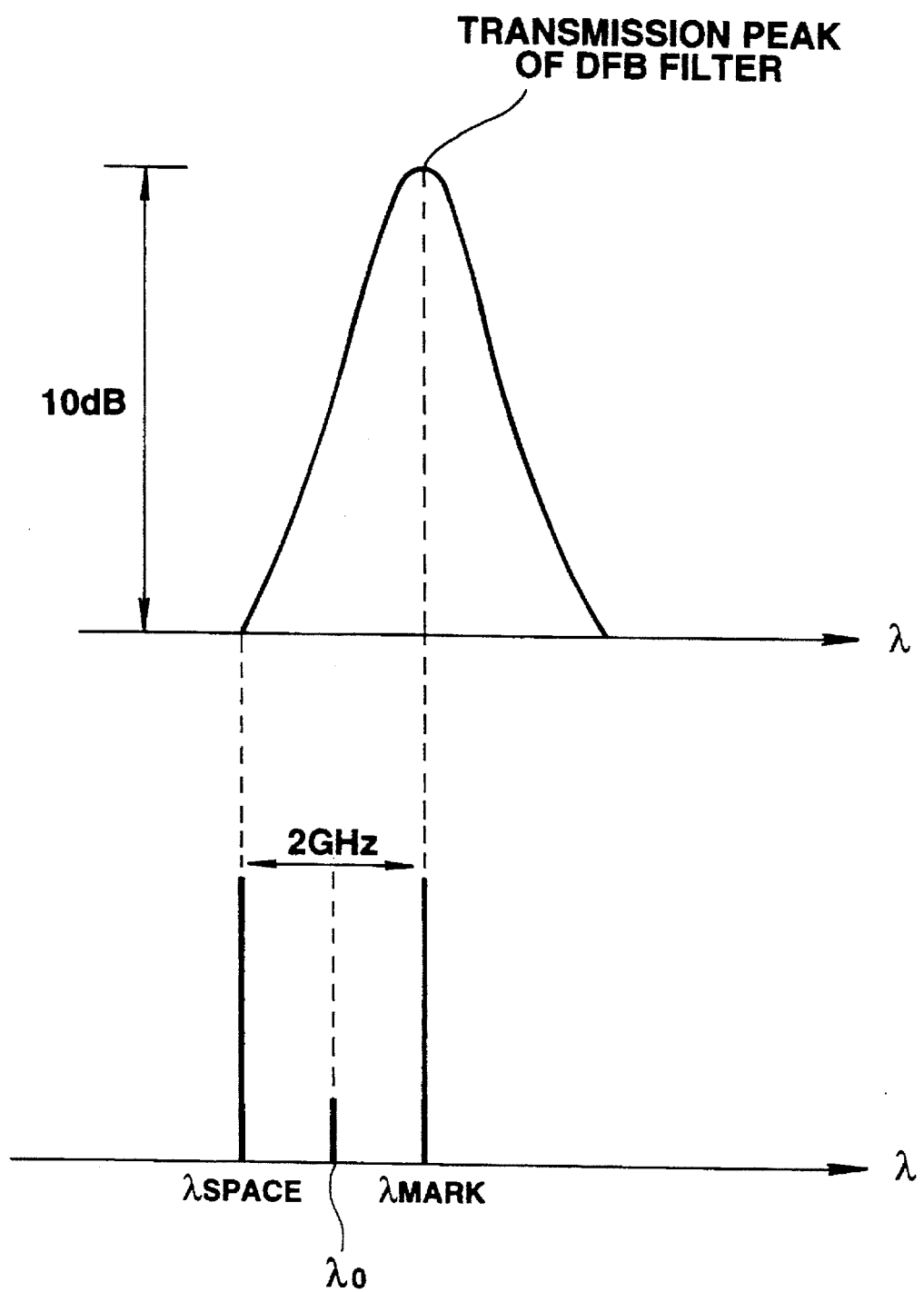
FIG. 17 is a graph for explaining a tuning method of the DFB filter of the eighth embodiment.

The maximum frequency deviation (i.e., a difference between a space frequency corresponding to "0" and a mark frequency corresponding to "1") of FSK modulation is set half the 10-dB down level bandwidth of the DFB filter, as shown in FIG. 17. In other words, 0.015 nm=2 GHz. As shown in FIG. 17, side modes appear at positions away from a wavelength λ0 of the carrier light by 0.0075 nm.

In this case, a method of setting a transmission peak position of each DFB filter is different from that in the seventh embodiment. As shown in FIG. 17, a transmission peak coincides with a mark frequency mark, and a space frequency space is set at a position where the transmission gain is reduced by 10 dB.

In this case, the band of frequencies occupied by one channel is widened, and the multiplicity is decreased as compared with that in the seventh embodiment, but an external modulator need not be used, resulting in convenience.

Ninth Embodiment

The ninth embodiment of the present invention exemplifies an optical transmission system in which modulation is performed by directly intensity-modulating a laser 802. The transmission system is identical to that in FIG. 16.

In direct intensity modulation, wavelength chirping occurs to widen the band of frequencies occupied by each channel, and the multiplicity is greatly reduced. The bandwidth of the occupied frequencies of each channel is about 3 Å. The transmission bandwidth of the DFB filter is also designed to be several Å accordingly.

In this case, an external modulator need not be used, and the wavelength need not be stabilized in both transmission and reception, resulting in convenience.

Tenth Embodiment

Figure 18:
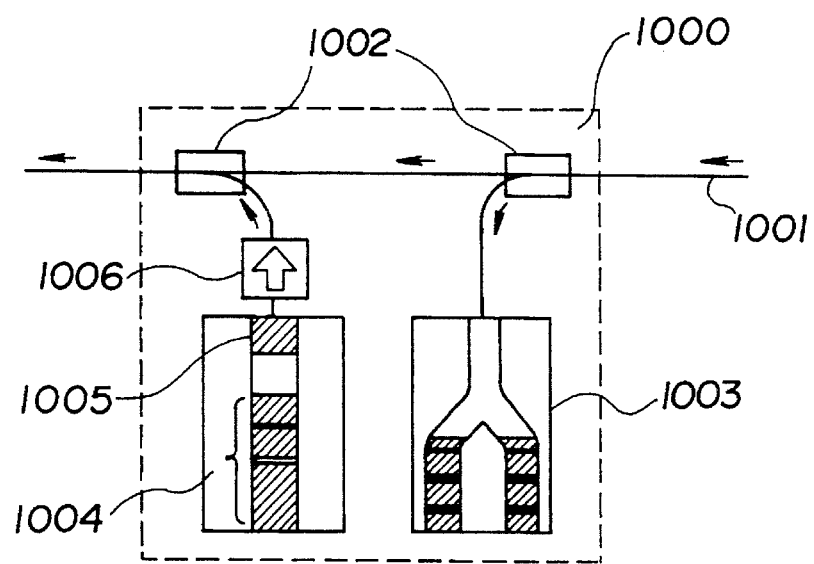
FIG. 18 is a plan view showing an arrangement in which an apparatus of the present invention is applied to an optical node.

FIG. 18 shows the arrangement of an opto-electric conversion unit (node) 1000 connected to each terminal 1010 when the apparatus and the optical communication system of the present invention are applied to an optical LAN system. FIG. 19 shows the arrangement of an optical LAN system using this node 1000.

An optical signal is received at the node 1000 using as a medium an optical fiber 1001 connected externally. Part of the optical signal is incident, through a beam splitter 1002, on an optical receiver 1003 constituted by any arrangement in the first to sixth embodiments of the present invention. An optical signal having a desired wavelength is extracted by this optical receiver 1003 to detect the signal. On the other hand, in transmission of an optical signal from the node 1000, light from a tunable DFB laser 1004 is modulated with an integrated optical modulator 1005 and is incident on the optical transmission line or optical fiber 1001 through an isolator 1006 and a beam splitter 1002.

In this case, an optical transmission system is identical to that of the seventh embodiment. However, the laser 1004 may be directly modulated to perform optical transmission according to the eighth or ninth embodiment. Two or more optical receivers 1003 and two or more tunable lasers 1004 may be arranged to widen the tunable ranges in both transmission and reception.

An optical LAN system network shown in FIG. 19 is of a bus type. Nodes 1000 are connected in A and B directions to arrange a large number of networked terminals 1010 and a center. Note that optical amplifiers for compensating optical attenuation must be arranged in series with each other along the transmission line 1001 to connect a large number of nodes 1000. Alternatively, two nodes may be connected to each terminal 1010, and two transmission lines are arranged to achieve bidirectional transmission according to a DQDB scheme.

In this optical network system, using the apparatus of the present invention, a wavelength multiplexing optical transmission network free from polarization dependency with a multiplicity of 30 can be configured as described in the seventh embodiment.

A network system may be a loop system obtained connecting A and B in FIG. 19, a star system, or a combination thereof.

Eleventh Embodiment

An optical CATV can be configured using the apparatus and the optical communication system of the present invention. A tunable laser is used in a CATV center 1020, and any one of the optical receivers of the first to sixth embodiments of the present invention is used on a subscriber side 1022 as a receiving party. It is conventionally difficult to use a DFB filter in such a system due to the influence of polarization. However, it is possible to use this DFB filter in the CATV system for the first time.

Figure 20:
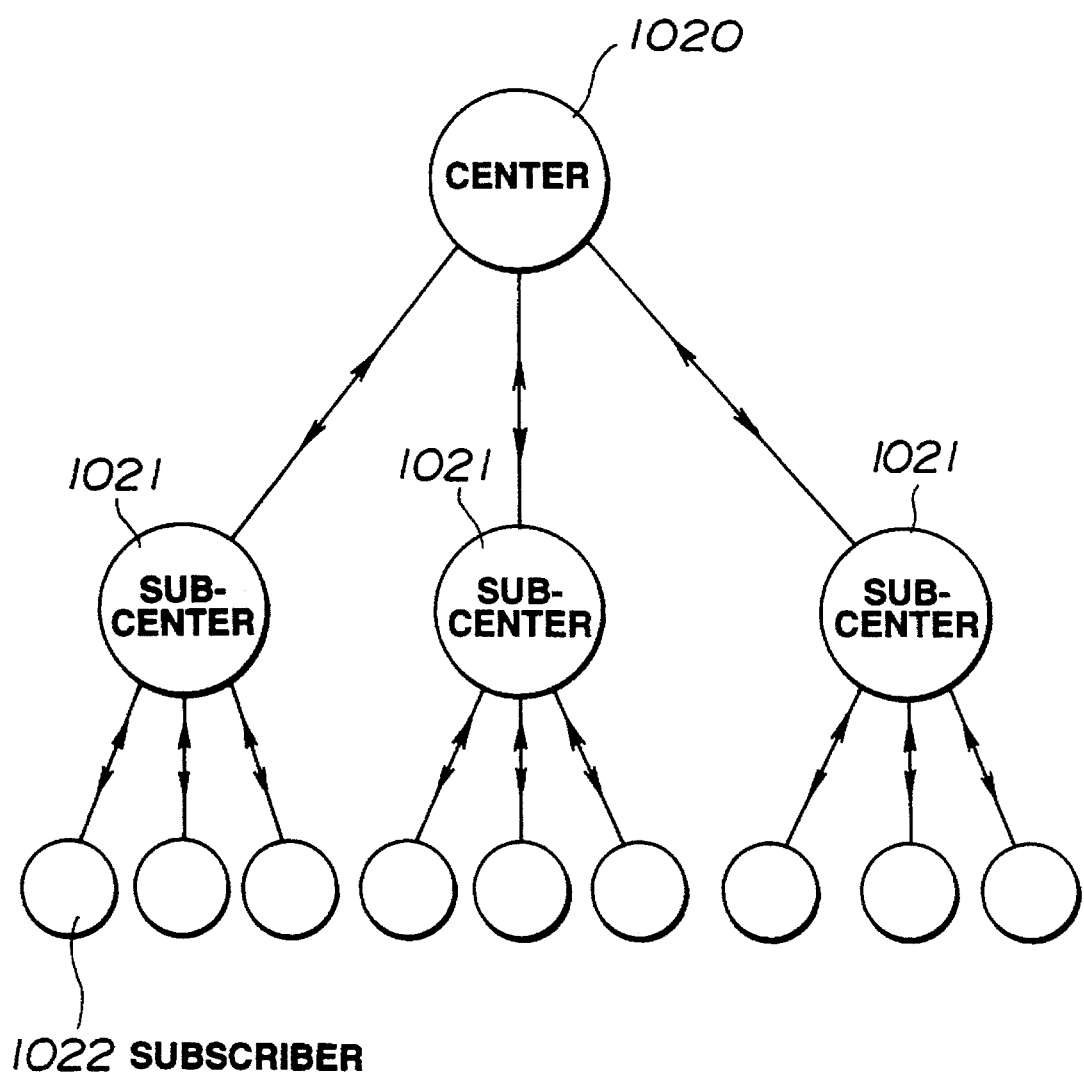
FIG. 20 is a diagram for explaining an optical CATV system.
Figure 21:
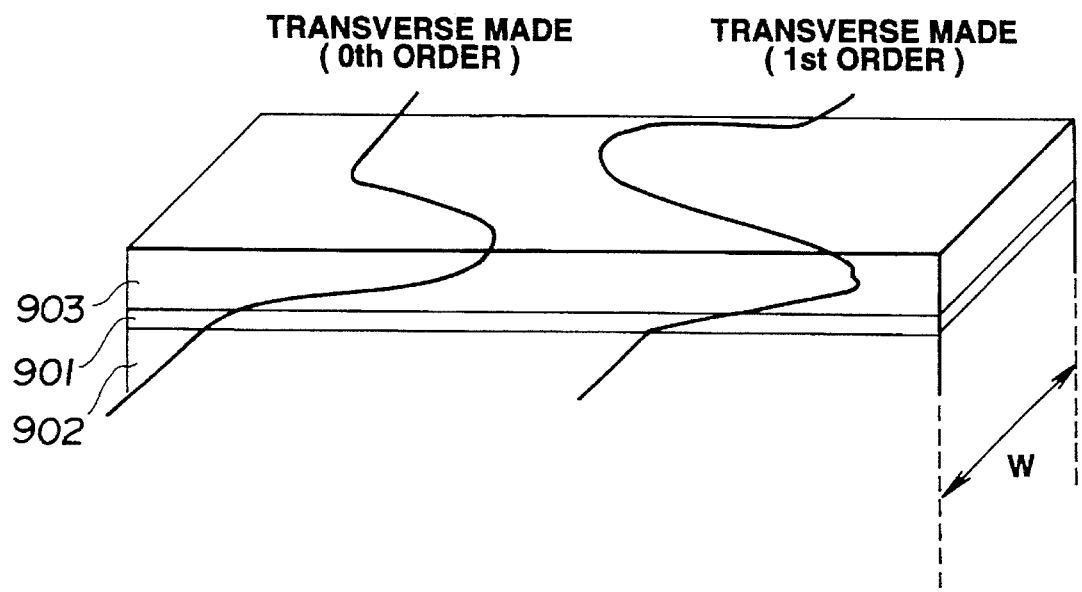
FIGS. 21A and 21B are a perspective view of a waveguide for explaining the principle of the second aspect of the present invention and a graph showing waveguide width dependency (mesa width) of an effective refractive index, respectively.
Figure 21:
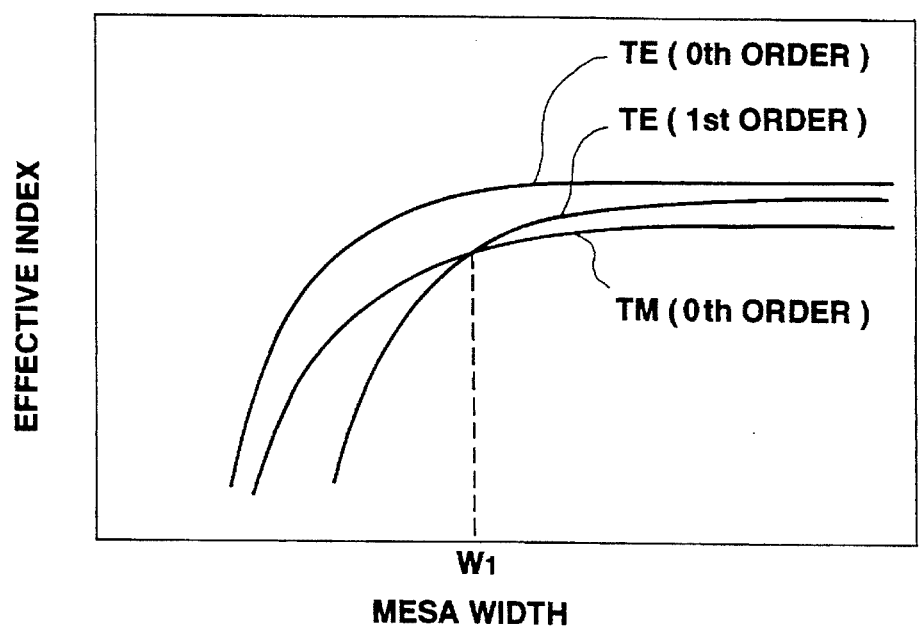

An external modulator is arranged on the subscriber side 1022 (i.e., an easy type bidirectional optical CATV; e.g., Ishikawa and Furuta, "Bidirectional Transmission LN External Modulator in Optical CATV Subscriber System", OSC 91-82 (1991)), a signal from the subscriber 1022 is received in the form of light (reflected light of a signal from a center 1020 or sub-center 1021) reflected by this external modulator, and a star network is configured, as shown in FIG. 20. Thus, bidirectional CATV can be realized to offer better services.

Twelfth Embodiment

The twelfth embodiment in the second aspect of the present invention will be described with reference to FIGS. 22 and 23.

Figure 22:
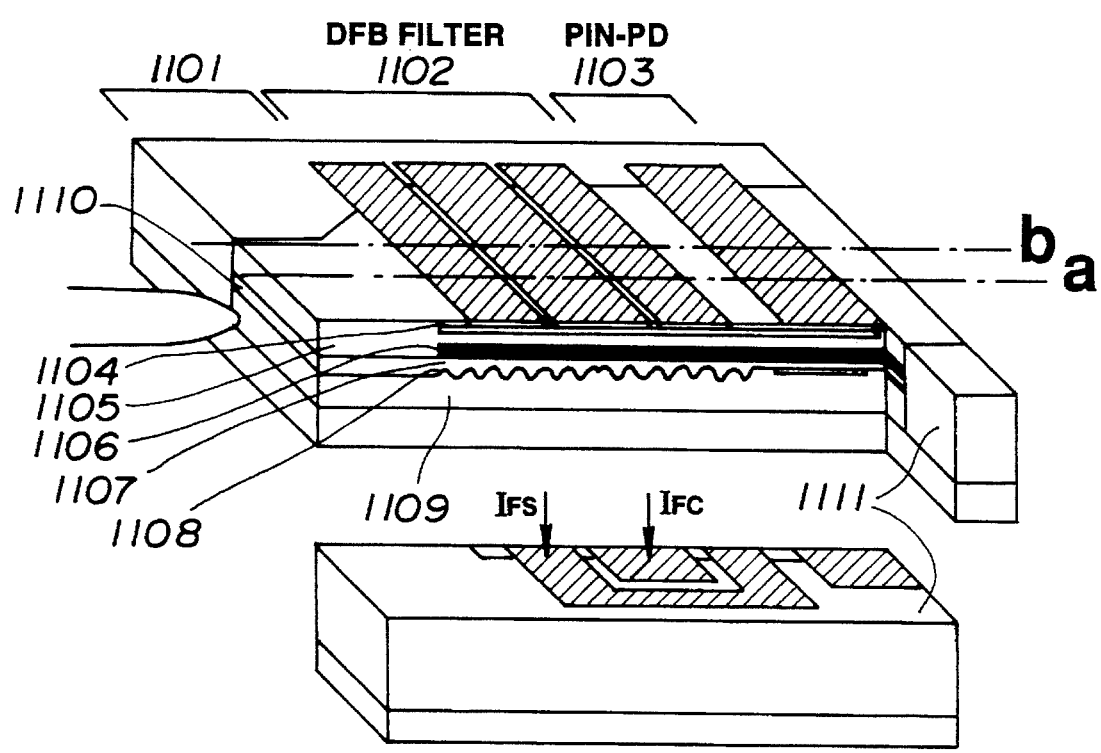
FIG. 22 is a sectional perspective view of an element according to the twelfth embodiment of the present invention.
Figure 23:
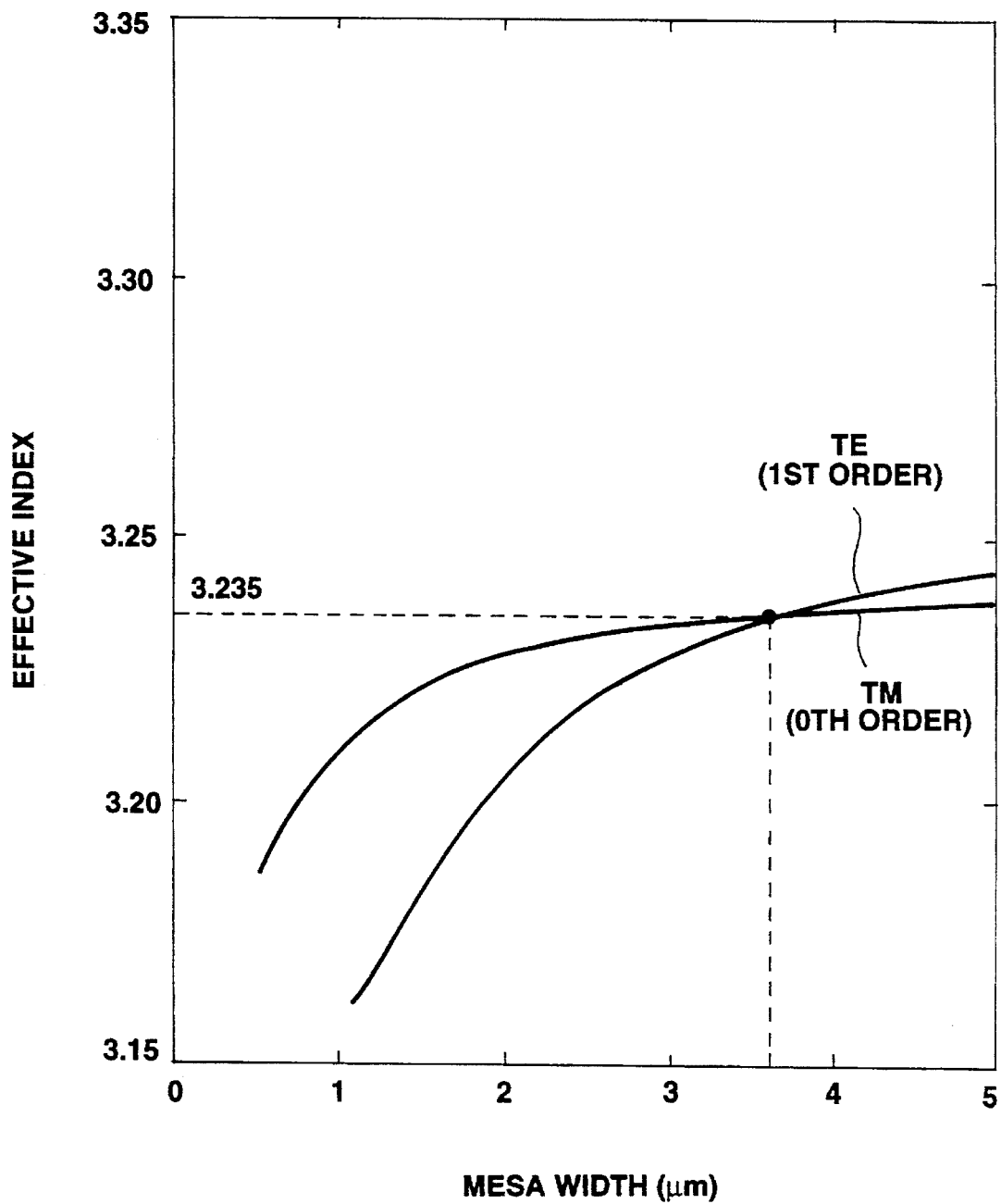
FIG. 23 is a graph showing waveguide width dependency of an effective refractive index to explain the principle of the twelfth embodiment.

FIG. 22 is a sectional perspective view of an optical receiver. Reference numeral 1101 denotes an input waveguide; 1102, a filter section constituted by a DFB filter; and 1103, a PD section constituted by a pin photodiode for detecting light passing through the DFB filter. The filter section 1102 comprises a three-electrode tunable DFB filter. Currents flowing through the DFB filter are two, i.e., a current IFS flowing in two short-circuited end portions, and a current IFC flowing in the central portion independently of the current IFS. When the ratio of these two currents is controlled, the transmission wavelength can be changed while the gain and the transmission bandwidth are kept constant. A diffraction grating of the DFB filter has a/4 shift region at its center. The layer structure of the DFB filter 1102 is constituted by a 0.5 μm thick p-$In_{0.59}Ga_{0.41}As_{0.9}P_{0.1}$ contact layer 1104, a 1.5 μm thick $In_{0.59}Ga_{0.41}As_{0.9}P_{0.1}$ active layer 1106, a 0.15 μm thick $In_{.71}Ga_{0.29}As_{0.62}P_{0.38}$ lower guiding layer 1107 having a 0.5- deep diffraction grating 1108, and an n-InP lower cladding layer 1109. This layer structure is surrounded by high-resistance InP 1111 for confinement of light and currents.

The input waveguide 1101 is obtained such that the structure is etched up to the active layer 1106, and an InP cladding layer 1105 is selectively regrown to obtain a 0.15 μm thick $In_{71}Ga_{0.29}As_{0.62}P_{0.38}$ guiding layer 1110.

When the width of a mesa portion serving as the waveguide in the above structure is changed, confinement of light changes, and the effective refractive index changes accordingly. The mesa width dependency of effective refractive indices for the 1st-order TE and 0th-order TM modes is shown in FIG. 23.

When a mesa width W1 of the DFB filter 1102 is set to 3.60 μm, the effective refractive indices for the 1st-order TE and 0th-order TM modes became equal to each other as 3.235. The pitch of the diffraction grating 108 is set at 0.2396 μm to obtain a transmission wavelength of 1.55 μm.

Signal light is coupled from the input waveguide 1101 to the DFB filter 1102 by the optical receiver having the above structure. A center line a of the input waveguide 1101 is not aligned with a center line b of the filter waveguide but is shifted therefrom by ¼ (i.e., 0.9 μm) of a filter waveguide width W1. Therefore, the coupling ratio of the 1st-order TE mode component becomes almost equal to that of the 0th-order TM mode component.

The TE mode component of the input signal light which is coupled to the 1st-order mode is transmitted through the filter 1102, and the TM mode component which is coupled to the 0th-order mode is transmitted through the filter 1102. Variations in OE-converted output obtained by the PD section 1103 can be suppressed to fall within 1 dB even if the polarization plane of the input signal light is changed.

Thirteenth Embodiment

In the thirteenth embodiment, a mode splitter is arranged between an input waveguide and a filter section constituted by two DFB filters each identical to those in the twelfth embodiment to obtain filter waveguides. After the input signal light is split into TE and TM modes, the wavelengths of these components are independently selected by separate filters. The thirteenth embodiment will be described with reference to FIG. 24.

Figure 24:
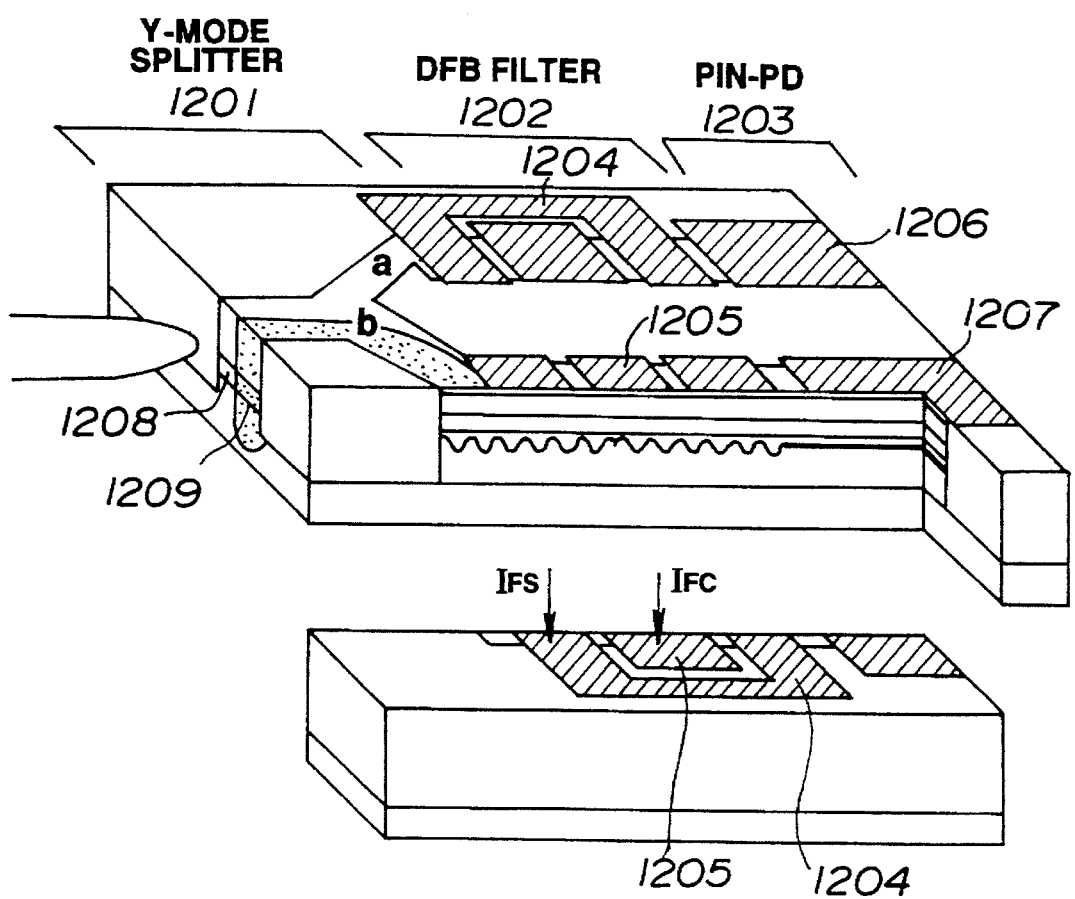
FIG. 24 is a sectional perspective view of an element according to the thirteenth embodiment of the present invention.

FIG. 24 is a sectional perspective view of an optical receiver. Reference numeral 1201 denotes a Y-mode splitter; 1202, a filter section constituted by two DFB filters 1024 and 1205; and 1203, a PD section constituted by pin photodiodes (PDs) 1206 and 1207 for detecting light components passing through the two DFB filters, respectively.

The DFB filters 1204 and 1205 and the PDs 1206 and 1027 have the same arrangements as those described with reference to the twelfth embodiment.

The Y-mode splitter 1201 has a waveguide 1208. In the twelfth embodiment, the waveguide is a bulk path obtained by selective regrowth. However, in this embodiment, the waveguide has a multiple quantum well (MQW) structure. Reference numeral 1209 denotes a selective mixed crystal region. Part of the waveguide 1208 is converted into a mixed crystal region 1209 by cap annealing. The TM mode light tends to be coupled to the mixed crystal region 1209, while the TE mode light tends not to be coupled to the mixed crystal region 1209. Of all the input signal light components, the TE mode light is coupled to the waveguide not containing a mixed crystal and is received by the PD 1206 through the filter 1204. The TM mode light is coupled to the mixed crystal region 1209 and is received by the PD 1207 through the filter 1205.

At this time, the splitter width is set to be ¼ or less the filter waveguide width so as to couple most of the split TE mode light to the 1st-order mode of the filter 1204, and the center of the splitter is shifted from the center of the filter 1204 by ¼ or more of the filter width. In addition, the width of the splitter is set to ¼ or less the filter waveguide so as to couple most of the split TM mode light to the 0th-order mode of the filter 1205, and the center of the splitter is aligned with the center of the filter waveguide.

If the filtering wavelength of the 1st-order TE mode of the filter 1204 is set equal to the filtering wavelength of the 0th-order TM mode of the filter 1205 in accordance with the same technique as in the twelfth embodiment, the filtering wavelength remains the same even if the polarization plane of the input signal light is rotated. Reception free from variations in light outputs passing through the filter section 1202 can be realized.

In the twelfth embodiment, the 1st-order TM mode light is abandoned, and the 0th-order TE mode light is also abandoned. However, in the thirteenth embodiment, splitting is performed by TE/TM mode splitting, and no modes are abandoned by the filters. Therefore, filtering with a higher gain can be realized.

The twelfth and thirteenth embodiments described above exemplify 1.55 μm band materials. However, similar means can be applied even in use of 1.3- and 0.6 μm band (GaAs-/AlGaAs-based materials).

In each of the twelfth and thirteenth embodiments, a DFB filter having a distributed feedback region is exemplified as an optical filter. However, a DBR filter in which a distributed reflector region and an active region are separated from each other can be used to obtain the same effect as described above.

Optical transmission as in the seventh, eighth, ninth, tenth, and eleventh embodiments can be performed even when the apparatuses of the twelfth and thirteenth embodiments in the second aspect of the present invention are used. The arrangements of the twelfth and thirteenth embodiments are substantially identical to those of the seventh, eighth, ninth, tenth, and eleventh embodiments.

Figure 25:
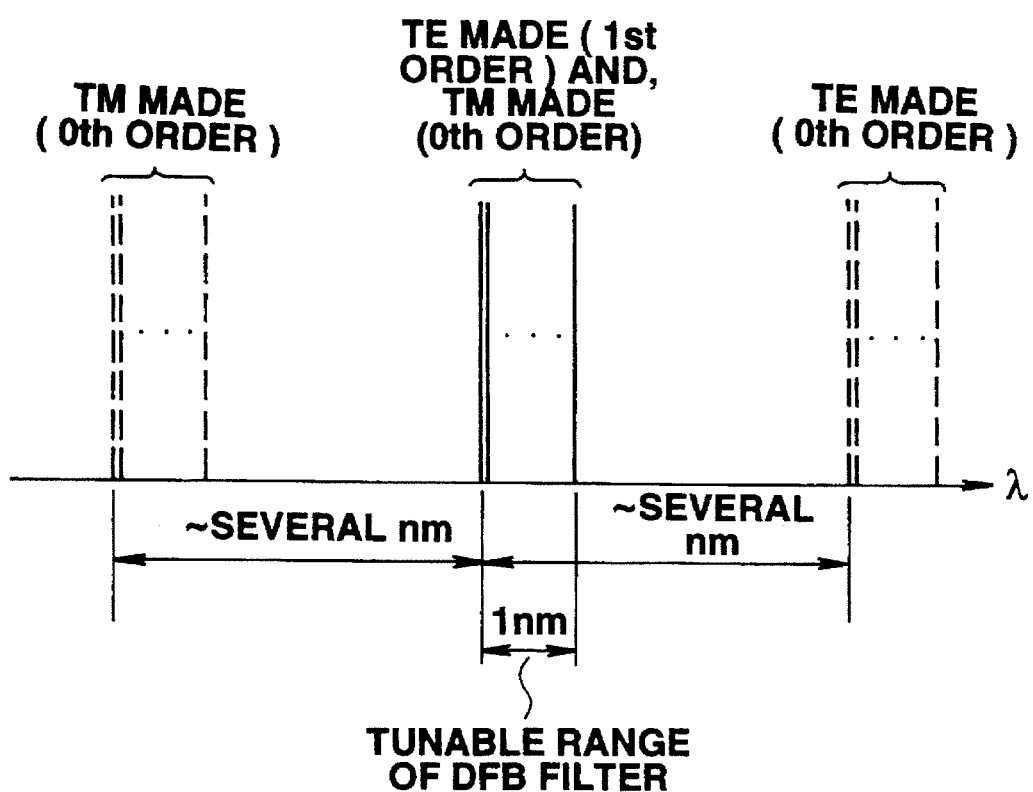
FIG. 25 is a view for explaining an optical frequency division multiplexing method in an optical communication system using the twelfth and thirteenth embodiments using the principle of the second aspect of the present invention.

Although the optical frequency division multiplexing method of the seventh embodiment has been described with reference to FIG. 15, an optical frequency division multiplexing method of the twelfth and thirteenth embodiments in the second aspect of the present invention will be described with reference to FIG. 25. Light components supposed to be normally abandoned, i.e., the 1st-order TM and 0th-order TE modes abandoned by the filters should be taken into consideration. The tuned wavelength for the 1st-order TM mode component of the filter is shifted from the 0th-order TM mode by several nm on the short-wavelength side, and the tuned wavelength of the 0th-order TE mode of the filter is shifted from the 1st-order TE mode by several nm on the long-wavelength side. These tuned wavelengths fall outside the 1-nm tunable range of the DFB filter and do not become crosstalk factors. To realize frequency division multiplexing with a crosstalk of 10 dB, if multiplexing is performed at a wavelength interval of about 0.03 nm, 1 nm/0.03 nm= 33, i.e., multiplexing transmission using about 30 channels can be realized because the 10-dB down level transmission bandwidth of the DFB filter is 0.03 nm, as described above.

According to the present invention, an optical receiver or optical semiconductor apparatus free from polarization dependency can be realized. In addition, an optical communication system such as a high-density optical frequency division multiplexing communication system can be configured using the optical receiver or optical semiconductor apparatus without requiring most advanced wavelength control and electronic circuit techniques as in coherent optical communications. According to the present invention, since an implementation is provided to allow the receiving side to be free from polarization dependency, communication free from polarization dependency can be performed even if a conventional transmitting/receiving apparatus is used.

What is claimed is:

1. An optical receiver comprising:
    an optical semiconductor apparatus comprising (i): beam splitting means and (ii) a plurality of optical filters, a plurality of light components split by said beam splitting means being coupled to said plurality of optical filters, respectively, and said plurality of optical filters being arranged such that a tuned transmission wavelength for a first transverse mode light component in one of said plurality of optical filters is set equal to that for a second transverse mode light component in another of said plurality of optical filters; and
    an opto-electric converter, said opto-electric converter being arranged to receive light components passing through said plurality of optical filters to convert the light components to an electric signal,
    wherein said first transverse mode is a TE mode and said second transverse mode is a TM mode.

2. A receiver according to claim 1, wherein said optical filters are arranged such that, when an effective refractive index for the TE mode light component passing through said one optical filter is defined as neff1(TE) at a predetermined tuned transmission wavelength, an effective refractive index neff2(TM) for the TM mode light component passing through said the other optical filter is set equal to the effective refractive index neff1(TE).

3. A receiver according to claim 2, wherein the effective refractive index neff2(TM) for the TM mode light component passing through said the other optical filter is set equal to the effective refractive index neff1(TE) by differentiating widths of said waveguides in said plurality of optical filters.

4. A receiver according to claim 2, wherein the effective refractive index neff2(TM) for the TM mode light component passing through said the other optical filter is set equal to the effective refractive index neff1(TE) by differentiating thicknesses of said waveguides in said plurality of optical filters.

5. A receiver according to claim 2, wherein the effective refractive index neff2(TM) for the TM mode light component passing through said the other optical filter is set equal to the effective refractive index neff1(TE) by differentiating compositions of said waveguides in said plurality of optical filters.

6. A receiver according to claim 1, wherein said optical filters are formed such that, when a pitch of said diffraction grating of said one optical filter, an effective refractive index for the TE mode light component passing through said one optical filter, a pitch of said diffraction grating of said other optical filter, and an effective refractive index for the TM mode light passing through said the other optical filter are defined as $\Lambda 1$, neff1(TE), $\Lambda 2$, and neff2(TM), respectively, a ratio of the pitch $\Lambda 1$ to the pitch $\Lambda 2$ is set equal to a ratio of a reciprocal of the effective refractive index neff1(TE) to a reciprocal of the effective refractive index neff2(TM).

7. A receiver according to claim 1, further comprising an optical multiplexer, arranged between said plurality of optical filters and said opto-electric converter, for multiplexing the light components passing through said plurality of optical filters and supplying multiplexed light to one opto-electric converter.

8. A receiver according to claim 7, wherein said optical multiplexer comprises a polarization multiplexer for multiplexing the TE and TM mode light components.

9. A receiver according to claim 1, wherein said beam splitter comprises a polarization splitter for splitting the TE and TM mode light components.

10. A receiver according to claim 1, wherein each of said optical filters comprises a distributed feedback filter.

11. A receiver according to claim 1, wherein each of said optical filters comprises a distributed Bragg reflector filter.

12. A receiver according to claim 10, wherein each of said optical filters has a plurality of electrodes, and the tuned transmission wavelength is tunable in accordance with control of currents supplied to said plurality of electrodes.

13. An optical semiconductor apparatus comprising:
    beam splitting means; and
    a plurality of optical filters, a plurality of light components split by said beam splitting means being coupled to said plurality of optical filters, respectively, and said plurality of optical filters being arranged such that a tuned transmission wavelength for a first transverse mode light component in one of said plurality of optical filters is set equal to that for a second transverse mode light component in the other of said plurality of optical filters.

14. An apparatus according to claim 13, wherein the first and second transverse mode light components are mutually orthogonal components.

15. An apparatus according to claim 14, wherein the first and second transverse mode light components are TE and TM mode light components, respectively.

16. An apparatus according to claim 13, wherein each of said optical filters comprises a waveguide optical filter having a distributed feedback portion constituted by a diffraction grating.

17. An apparatus according to claim 13, further comprising an opto-electric converter for receiving light components passing through said plurality of optical filters.

18. An optical communication system comprising:
    (a) a semiconductor laser for supplying a modulated signal light;
    (b) an optical fiber for transmitting the signal light therethrough; and
    (c) an optical receiver for directly detecting the signal light, said optical receiver comprising:
    an optical semiconductor apparatus comprising (i):
    beam splitting means and (ii) a plurality of optical filters, a plurality of light components split by said beam splitting means being coupled to said plurality of optical filters, respectively, and said plurality of optical filters being arranged such that a tuned transmission wavelength for a first transverse mode light component in one of said plurality of optical filters is set equal to that for a second transverse mode light component in the other of said plurality of optical filters; and
    an opto-electric converter, said opto-electric converter being arranged to receive light components passing through said optical filters to convert the light components to an electric signal,
    wherein said first transverse mode is a TE mode and said second transverse mode is a TM mode.

19. An optical communication system comprising:
    (a) a semiconductor laser for supplying a modulated signal light;

(b) an optical fiber for transmitting the signal light therethrough; and (c) an optical semiconductor apparatus for directly detecting the signal light, said optical semiconductor apparatus comprising:

beam splitting means; and a plurality of optical filters, a plurality of light components split by said beam splitting means being coupled to said plurality of optical filters, respectively, and said plurality of optical filters being arranged such that a tuned transmission wavelength for a first transverse mode light component in one of said plurality of optical filters is set equal to that for a second transverse mode light component in the other of said plurality of optical filters.

20. A system according to claim 19, wherein said semiconductor laser has a plurality of electrodes and an oscillation wavelength of said laser is tunable under the control of currents supplied to said plurality of electrodes.

21. A system according to claim 19, wherein a scheme for modulating said semiconductor laser is intensity modulation using an external intensity modulator.

22. A system according to claim 19, wherein a scheme for modulating said semiconductor laser is direct frequency modulation by superposing a signal on a current injected into said semiconductor laser, and a scheme for performing the direct detection in said optical filters is a scheme of converting a variation in frequency into a variation in transmission intensity utilizing frequency discrimination characteristics of transmission spectra of said optical filters constituting said optical semiconductor apparatus.

23. A system according to claim 22, wherein the frequency modulation is direct FSK (Frequency Shift Keying) modulation for code communication.

24. A system according to claim 19, wherein a scheme for modulating said semiconductor laser is direct intensity modulation by superposing a signal on a current injected into said semiconductor laser.

25. A system according to claim 19, wherein a scheme for setting a tuned transmission wavelength of each of said optical filters constituting said optical semiconductor apparatus to a predetermined wavelength and stably coinciding therewith is a scheme of causing an oscillator to superpose a low-frequency signal having a small amplitude on a DC drive current of said each optical filter, performing synchronous detection between the low-frequency signal from said oscillator and an electrical signal obtained from a photodetector, and performing negative feedback control to the DC drive current through a low-pass filter.

26. An optical receiver comprising:

an optical input waveguide means for receiving light from outside; and a filter waveguide means connected to said input waveguide means, said optical filter waveguide means having a distributed feedback portion constituted by a diffraction grating, and being constituted so that (i) propagation constants for mutually orthogonal polarization modes having different transverse mode orders are equal to each other and (ii) such that an effective refractive index for a 0th order TM mode light component is equal to an effective refractive index for a higher order TE mode light component, wherein said optical input waveguide means and said filter waveguide means are constituted such that light propagated through said optical input waveguide means is coupled to 0th and first order modes of said filter waveguide means with the same coupling coefficient.

27. An optical receiver comprising:

an optical input waveguide means for receiving light from outside;

a TE-TM mode splitter for splitting light from said input waveguide means into TE and TM light components; and first and second waveguide type optical filters, each of said optical filters has a waveguide having a distributed feedback portion constituted by a diffraction grating, the TE mode light component split by said mode splitter being coupled to a first order mode of said first optical filter and the TM mode light component split by said mode splitter being coupled to a 0th order mode of said second optical filter.

28. An optical semiconductor apparatus comprising:

an optical input waveguide means for receiving light from outside;

a mode splitter for splitting light from said input waveguide means into first and second mode light components; and first and second waveguide type optical filters, the first mode light component split by said mode splitter being coupled to a first order mode of said first optical filter and the second mode light component split by said mode splitter being coupled to a 0th order mode of said second optical filter.

29. An apparatus according to claim 28, wherein the first and second mode light components are mutually orthogonal components.

30. An apparatus according to claim 28, wherein the first and second mode light components are TE and TM mode light components, respectively.

31. An apparatus according to claim 28, wherein each of said optical filters comprises a waveguide optical filter having a distributed feedback portion constituted by a diffraction grating.

32. An apparatus according to claim 28, further comprising an opto-electric converter for receiving light components passing through said optical filters.

33. An apparatus according to claim 28, wherein each of said optical filters has a plurality of electrodes, and the tuned transmission wavelength is tunable in accordance with control of currents supplied to said plurality of electrodes.

* * * * *

UNITED STATES PATENT AND TRADEMARK OFFICE
CERTIFICATE OF CORRECTION

PATENT NO. : 5,479,544
DATED : December 26, 1995
INVENTOR(S) : Ono et al

It is certified that error appears in the above-indentified patent and that said Letters Patent is hereby corrected as shown below:

<u>COLUMN 1</u>:

Line 40, "A" should read --Å--.

<u>COLUMN 6</u>,

Line 44, "line." (second occurrence) should be deleted.

<u>COLUMN 7</u>:

Line 53, "clement" should read --element--.

<u>COLUMN 19</u>:

Line 10, "comprising (i):" should read --comprising: (i)--.

UNITED STATES PATENT AND TRADEMARK OFFICE
CERTIFICATE OF CORRECTION

PATENT NO. : 5,479,544

DATED : December 26, 1995

INVENTOR(S) : Ono et al.

It is certified that error appears in the above-indentified patent and that said Letters Patent is hereby corrected as shown below:

<u>COLUMN 20</u>:

Line 47, "comprising (i):" should read --comprising: (i)--.

Signed and Sealed this

Twenty-third Day of July, 1996

*Attest:*

BRUCE LEHMAN

*Attesting Officer*     *Commissioner of Patents and Trademarks*